(12) United States Patent
Nakamura et al.

(10) Patent No.: US 6,875,920 B2
(45) Date of Patent: Apr. 5, 2005

(54) SEMICONDUCTOR DEVICE AND DESIGN SUPPORT METHOD OF ELECTRONIC DEVICE USING THE SAME

(75) Inventors: Satoshi Nakamura, Yokohama (JP); Takashi Suga, Yokohama (JP); Atsushi Nakamura, Fuchu (JP); Hitoshi Yokota, Kawasaki (JP); Tsutomu Hara, Yokohama (JP); Kouichi Uesaka, Kawasaki (JP); Tatsuji Noma, Yokohama (JP); Makoto Torigoe, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 194 days.

(21) Appl. No.: 10/243,965

(22) Filed: Sep. 13, 2002

(65) Prior Publication Data
US 2003/0052395 A1 Mar. 20, 2003

(30) Foreign Application Priority Data
Sep. 13, 2001 (JP) .................................... 2001-277424

(51) Int. Cl.[7] .............................................. H01L 23/02
(52) U.S. Cl. ...................................... 174/52.4; 257/665
(58) Field of Search ........................ 174/52.4; 257/691, 257/665

(56) References Cited

U.S. PATENT DOCUMENTS 6,608,375 B2 * 8/2003 Terui et al. ................. 257/691

FOREIGN PATENT DOCUMENTS

| JP | 05225360 | 9/1993 |
|----|----------|--------|
| JP | 07007063 | 1/1995 |
| JP | 07294594 | 11/1995 |
| JP | 10223997 | 8/1998 |
| JP | 11103018 | 4/1999 |
| JP | 11-142453 | 5/1999 |
| JP | 20000174087 | 6/2000 |
| JP | 201119110 | 4/2001 |
| JP | 2001116807 | 4/2001 |
| JP | 2001118948 | 4/2001 |
| JP | 2001194421 | 7/2001 |
| JP | 2002-71737 | 3/2002 |
| WO | WO 00/65651 | 11/2000 |

* cited by examiner

*Primary Examiner*—Hung V. Ngo
(74) *Attorney, Agent, or Firm*—Townsend and Townsend and Crew LLP

(57) ABSTRACT

A semiconductor device includes a semiconductor die having patterned circuitry, a plurality of terminals coupled to the die, and an indication providing signal noise information of at least one of the terminals.

38 Claims, 22 Drawing Sheets when electric current is made to flow at position of x=320 μm measured value of near magnetic field distribution
(coordinates-magnetic field strength characteristics)

measured values of near magnetic field distribution
(time-magnetic field strength characteristics)
($x \to t$ (=x/c, c: speed of light))

complex Fourier transform time waveforms as result of Fourier transform values of time waveforms at phases n π
as result of Fourier transform calculation result of electric
current distribution

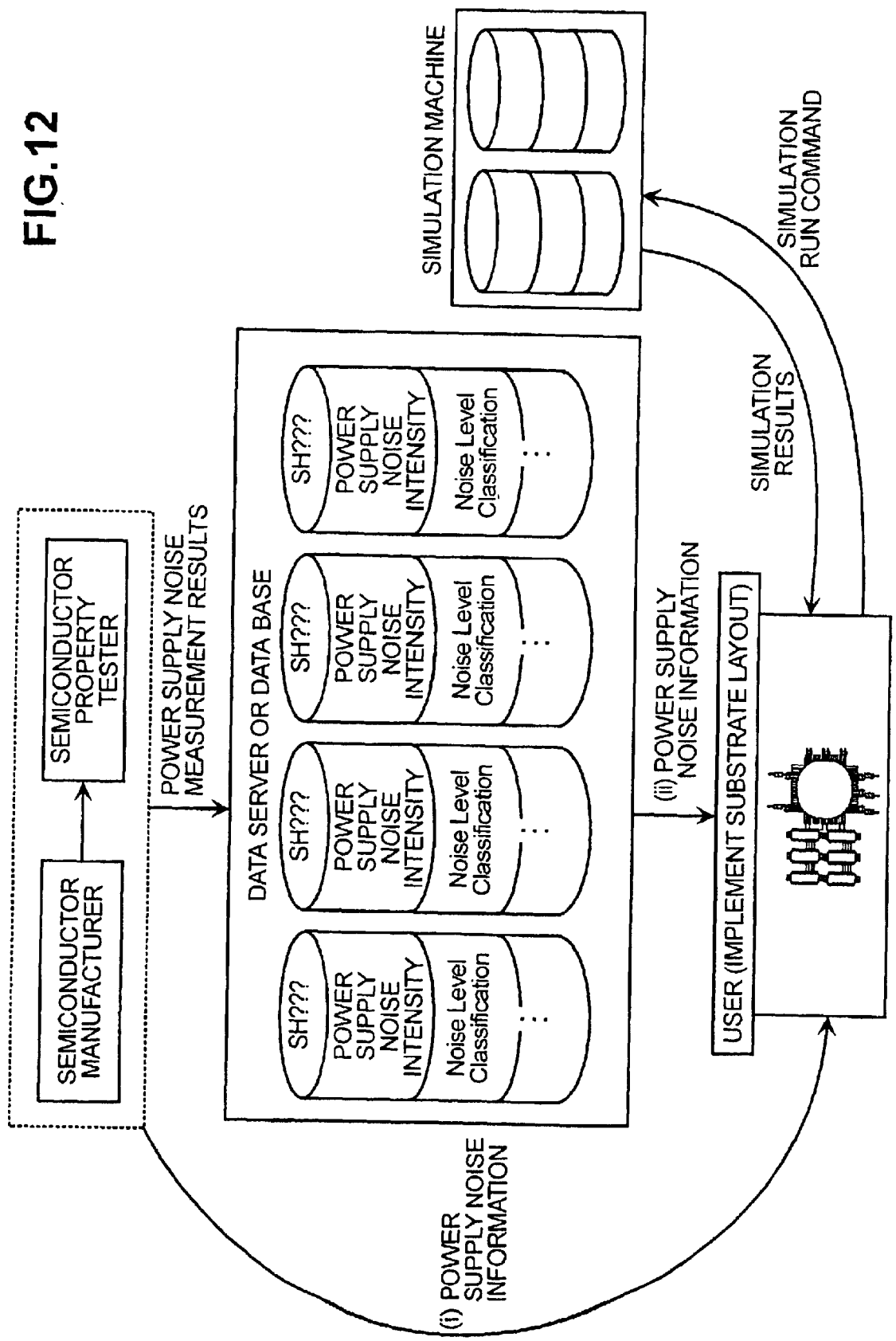

O.O ABSOLUTE MAXIMUM RATING
TABLE O.O ABSOLUTE MAXIMUM RATING

| ITEM | SYMBOL | RATED VALUE | UNIT |
|---|---|---|---|
| I/O, PLL, RTC POWER SUPPLY VOLTAGE | $V_{DDQ}$ $V_{DD\text{-}PLL}$ $V_{DD\text{-}RTC}$ $V_{DD\text{-}CPG}$ | -0.3~4.2 | V |
| INTERNAL POWER SUPPLY VOLTAGE | $V_{DDQ}$ | -0.3~2.5 | V |
| INPUT VOLTAGE | $V_{In}$ | -0.3~$V_{DD}$+0.3 | V |
| OPERATING TEMPERATURE | $T_{opr}$ | -20~75, -40~85 | °C |
| STORAGE TEMPERATURE | $T_{stg}$ | -55~125 | °C |

[NOTE] THE MAXIMUM RATING . . . . . . . . . . . . .
. . . . . . . . . . . . . . . . . . .

FIG.15

| ITEM | | SYM-BOL | Min | Typ | Max | UNIT | TEST CONDITIONS |
|---|---|---|---|---|---|---|---|
| POWER SUPPLY VOLTAGE | | $V_{DDQ}$ $V_{DD-PLL}$ $V_{DD-RTC}$ $V_{DD-CPG}$ | 3.0 | 3.3 | 3.6 | V | NORMAL MODE SLEEP MODE DEEP SLEEP MODE STANDBY MODE |
| | | $V_{DD}$ | 1.8 | 1.95 | 2.07 | | NORMAL MODE SLEEP MODE DEEP SLEEP MODE STANDBY MODE |
| POWER CONSUMP-TION | NORMAL OPERATION | $I_{DD}$ | — | 1000 | 1200 | mA | $I\phi$ = 200MHz |
| | SLEEP MODE | | — | 165 | — | | |
| | STANDBY MODE | | — | — | 2000 | μA | Ta = 25°C (RTC on) |
| | | | — | — | 5000 | | Ta > 25°C (RTC on) |
| ⋮ | | ⋮ | | ⋮ | | | ⋮ |

O.O DC CHARACTERISTICS
TABLE O.O DC CHARACTERISTICS

[NOTE] 1 . . . . . . . . . . . . . . . . . . .
. . . . . . . . . . . . . .

FIG.16

○.○ AC CHARACTERISTICS
TABLE ○.○ CLOCK TIMING (□□□□□□)

| ITEM | | SYMBOL | Min | Typ | Max | UNIT |
|---|---|---|---|---|---|---|
| OPERATING FREQUENCY | CPU, FPU, CACHE, TLB | f | — | — | 200 | MHz |
| | EXTERNAL BUS | | — | — | 100 | |
| | PERIPHERAL MODULE | | — | — | 50 | |

TABLE ○.○ CLOCK TIMING (△△△△△△)

| ITEM | | SYMBOL | Min | Typ | Max | UNIT |
|---|---|---|---|---|---|---|
| OPERATING FREQUENCY | CPU, FPU, CACHE, TLB | f | — | — | 200 | MHz |
| | EXTERNAL BUS | | — | — | 100 | |
| | PERIPHERAL MODULE | | — | — | 50 | |

FIG.17

○.○ CLOCK AND CONTROL SIGNAL TIMING
TABLE ○.○ □□□□□□ CLOCK AND CONTROL SIGNAL TIMING

| ITEM | | | SYMBOL | Min | Max | UNIT | REFERENCE DIAGRAM |
|---|---|---|---|---|---|---|---|
| EXTAL CLOCK INPUT FREQUENCY | PLL2 IN OPERATION | 1/2div. IN OPERATION | $f_{EX}$ | 16 | 66.7 | MHz | |
| | | 1/2div. IN NON-OPERATION | | 8 | 33.3 | | |
| | PLL2 IN NON-OPERATION | 1/2div. IN OPERATION | | 2 | 66.7 | | |
| | | 1/2div. IN NON-OPERATION | | 1 | 33.3 | | |
| EXTAL CLOCK INPUT CYCLE TIME | | | $f_{EXcyc}$ | 15 | 1000 | ns | 23.1 |
| EXTAL CLOCK INPUT LOW-LEVEL PULSE WIDTH | | | $f_{EXL}$ | 3.5 | — | ns | 23.1 |
| EXTAL CLOCK INPUT LOW-LEVEL PULSE WIDTH | | | $f_{EXH}$ | 3.5 | — | ns | 23.1 |
| EXTAL CLOCK OUTPUT RISE TIME | | | $f_{EXr}$ | — | 4 | ns | 23.1 |
| EXTAL CLOCK OUTPUT FALL TIME | | | $f_{EXf}$ | — | 4 | ns | 23.1 |
| ⋮ | | | | ⋮ | | | |

[NOTE] · · · · · · · · · · · · · · · · · · · · · · · · ·

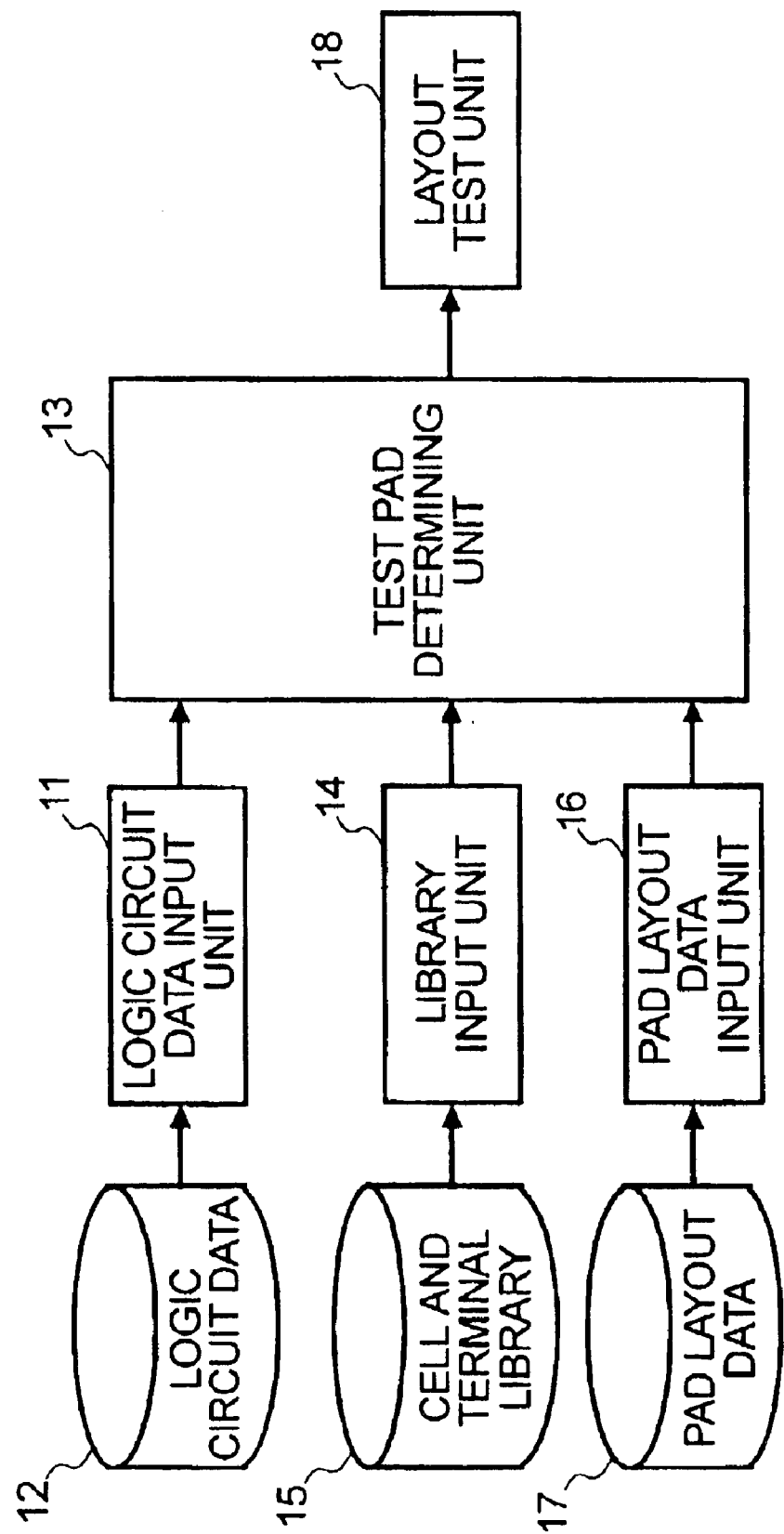

SEMICONDUCTOR DEVICE AND DESIGN SUPPORT METHOD OF ELECTRONIC DEVICE USING THE SAME

CROSS-REFERENCES TO RELATED APPLICATIONS

The present application is related to and claims priority from Japanese Patent Application No. 2001-277424, filed on Sep. 13, 2001.

BACKGROUND OF THE INVENTION

The present invention relates to a semiconductor device and a design support method of an electronic device having the semiconductor device assembled on a substrate or printed circuit board.

At present, data sheets or sales catalog for showing the performance of semiconductor devices, such as microprocessors and LSIs (e.g., ASICs), describe the electric characteristics of the LSIs: (1) absolute rating (FIG. 14); (2) DC characteristics (FIG. 15); and (3) AC characteristics (FIG. 16). In addition, the timing accuracy and delay time for clock and control and bus signals of each of signal terminals are provided to describe the AC characteristics(FIG. 17).

However, the description of EMI (Electro Magnetic Interference) in a substrate packaged with the LSI and in a device mounted with the substrate is not generally provided. The description on power supply noise intensity of the power supply terminals and GND terminals of an LSI also is not generally provided. These electrical characteristics have a significant effect on operating accuracy of the substrate and the device. Similarly, the description on countermeasures to noises for the terminals and priority of the countermeasures are not described in the data sheets or product catalogs.

Japanese Patent Laid-Open No. 7063/1995 discloses a highly accurate verification method in which a signal pad subject to noises is identified according to logic circuit data and cell attributes in power/GND pads and signal pads of an LSI and a mutual noise figure is sought between the signal pad and the power/GND pads to determine whether a power/GND pad generating noises exists near the signal pad subject to noises, as shown in FIG. 18. Japanese Patent Laid-Open No. 174087/2000 discloses a noise analyzer capable of taking efficient countermeasures to power supply noises in which a power system net list of an LSI chip is extracted and power system noise current is simulated to show the power system net list and the simulation results, as shown in FIG. 19.

However, for users installing an LSI on a substrate, it has been difficult to obtain power supply noise intensity information and noise level classification information about all the power supply and GND terminals in the LSI even if the verification method or analyzer is used.

On this account, the users have installed countermeasure components, such as a bypass condenser or EMI filter, for every power supply and GND terminal of the LSI, in order to reduce the electromagnetic interference in the substrate or device, or to stabilize operations of the substrate or the device. Alternatively, the users themselves have tested the noise intensity of every power supply and GND terminal of a semiconductor device, identified the power supply and GND terminals with a high noise intensity, and then installed the countermeasure components.

SUMMARY OF THE INVENTION

Although some terminals have a low power supply noise intensity and do not need any noise countermeasures, a bypass condenser or EMI filter is packaged for all the power supply and GND terminals since such terminals cannot be readily identified. This increases the number of components used in assembling a module and the area of a substrate used for the module, which increases manufacturing costs and hinders the efforts to scale down the semiconductor modules.

In addition, it is not easy for the users themselves to identify the terminals with high power noise intensities by measuring magnetic field distributions or terminal potential near the LSI terminals due to frequent use of surface-mounted LSIs, such as BGA (Ball Grid Array) and CSP (Chip Size Package), with the recent development of high-density packaging techniques.

In one embodiment, a semiconductor device includes a semiconductor die having patterned circuitry, a plurality of terminals coupled to the die, and an indication providing signal noise information of at least one of the terminals.

In another embodiment, a component for manufacturing an electronic device includes a semiconductor die having patterned circuitry, a plurality of terminals coupled to the die, and an indication providing signal noise information about at least one of the terminals.

In another embodiment, a semiconductor device includes a semiconductor die having patterned circuitry, a plurality of power terminals coupled to the die, a package enclosing the die and portions of the plurality of power terminals, and an indication providing signal noise information of at least one of the power terminals. The signal noise information is a noise level classification or a noise level intensity. The indication is provided on the package or the at least one power terminal.

In another embodiment, a semiconductor device includes a semiconductor die having patterned circuitry, a plurality of power terminals coupled to the die, a package enclosing the die and portions of the plurality of power terminals, and a marking providing signal noise information of at least one of the power terminals. The marking is provided on the package or the at least one power terminal. The signal noise information is a noise level classification or a noise level intensity. The signal noise information is derived from determining electromagnetic interferences for each of the power terminals.

Yet another embodiment of the present invention relates to a method of designing an electronic device having a semiconductor device and a printed circuit board whereon the semiconductor device is installed includes. The method includes obtaining signal noise levels for a plurality of terminals of the semiconductor device, providing noise information on an information recording medium about at least one of the terminals of the semiconductor device that requires a suppression component to reduce a high signal noise level associated with the at least one terminals, and determining a suitable layout design of the electronic device using the noise information provided in the information recording medium.

Yet another embodiment of the present invention relates to a method of designing an electronic device having a semiconductor device and a printed circuit board whereon the semiconductor device is installed. Signal noise levels for a plurality of terminals of the semiconductor device is obtained. Noise information on an information recording medium about at least one of the terminals of the semiconductor device that requires a suppression component to reduce a high signal noise level associated with the at least one terminals is provided. A suitable layout design of the electronic device is determined using the noise information provided in the information recording medium.

The information recording medium is one selected from a group consisting of: a printed document, a package of the semiconductor device, the at least one terminal, a computer readable medium, and a device library in a computer aided design system. The suitable layout design includes a first group of the terminals and a second group of the terminals. The first group is provided with suppression components and a second group is not provided with suppression components.

Yet another embodiment of the present invention relates to a method for providing a component used in manufacturing an electronic device. The electronic device includes a semiconductor device and a printed circuit board. The method includes determining signal noise levels for each of a plurality of power terminals of the semiconductor device, and providing information on an information recording medium about at least one of the power terminals of the semiconductor device that requires a suppression component when the semiconductor device is assembled onto the circuit board to reduce a high signal noise level associated with the at least one terminal.

BRIEF DESCRIPTION OF THE DRAWINGS

The teachings of the invention can be readily understood by considering the following detailed description in conjunction with the accompanying drawings, in which:

FIG. 12 depicts a diagram illustrating a flow of power supply noise intensity information, noise level classification information, and information about simulations of a semiconductor device;

FIG. 15 depicts the DC characteristics of a semiconductor device described in a traditional data sheet;

FIG. 16 depicts the AC characteristics of a semiconductor device described in a traditional data sheet;

FIG. 17 depicts the clock and control signal timing characteristics described in a traditional data sheet;

FIG. 18 depicts a block diagram of a noise verification apparatus; and

DESCRIPTION OF THE PREFERRED EMBODIMENTS

Hereafter, embodiments of the invention will be described in detail with reference to the drawings. In addition, components having the same function are designated generally with the same numerals and signs for illustrative reasons and should not be used to limit the scope of the present invention Embodiment 1

Figure 1:
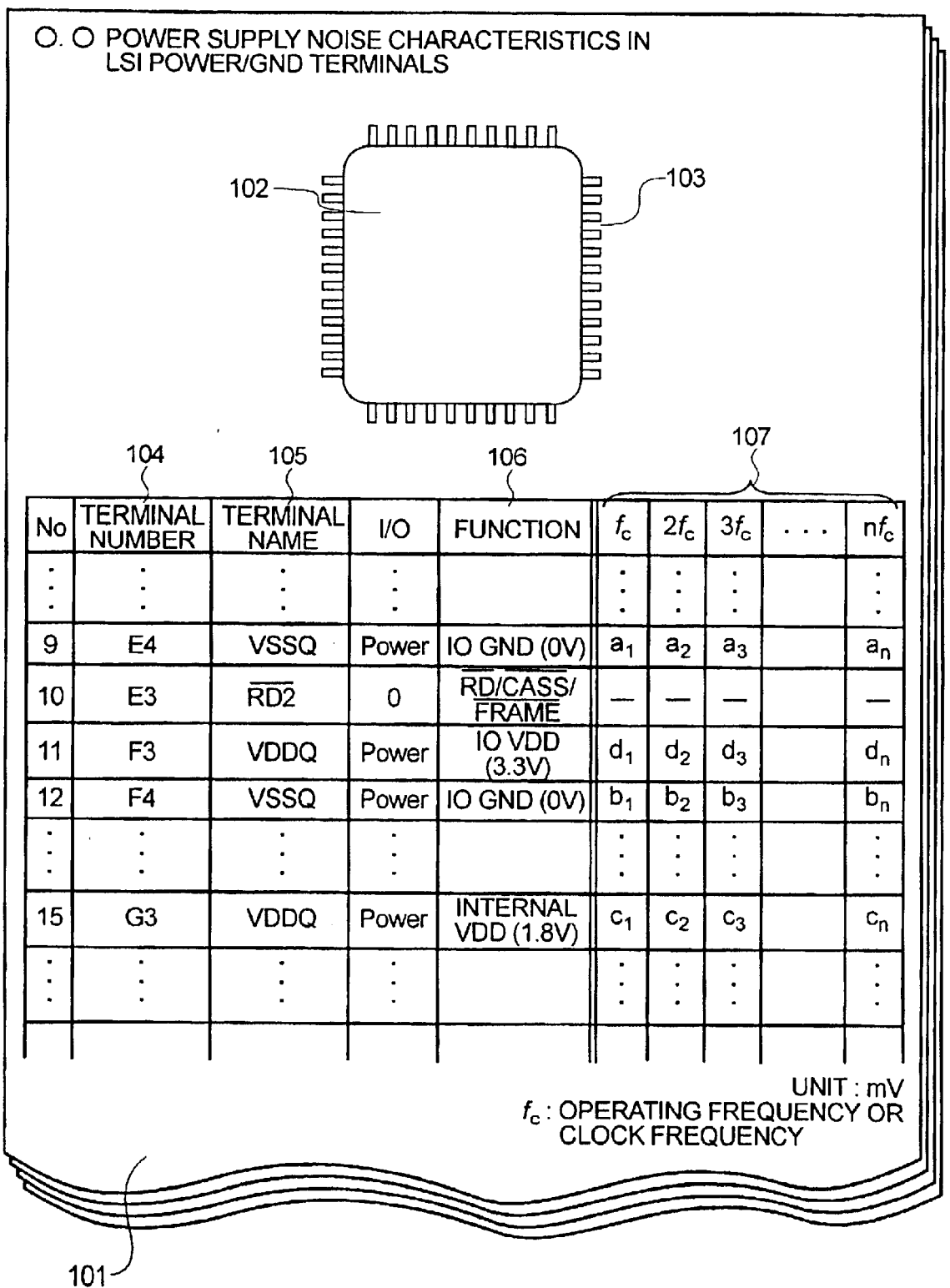
FIG. 1 depicts a diagram illustrating one example of a data sheet for reporting information about electric characteristics at predetermined power supply terminals of a semiconductor device.

FIG. 1 depicts a diagram illustrating a data sheet, catalogue or specification providing information about electrical characteristics of predetermined power supply terminals of a semiconductor device.

A data sheet 101 shows the electric characteristics of all terminals in a semiconductor device, such as a microprocessor 102. The microprocessor has the characteristics described in the data sheet 101 and includes terminals 103. A column104 provides terminal numbers of the terminals 103 to identify the terminals. A column 105 provides terminal names of the corresponding terminals 103. A column 106 provides functions performed by the corresponding terminals 103. A column 107 provides a power supply noise intensity to an operating frequency in the corresponding terminals.

Figure 2A:
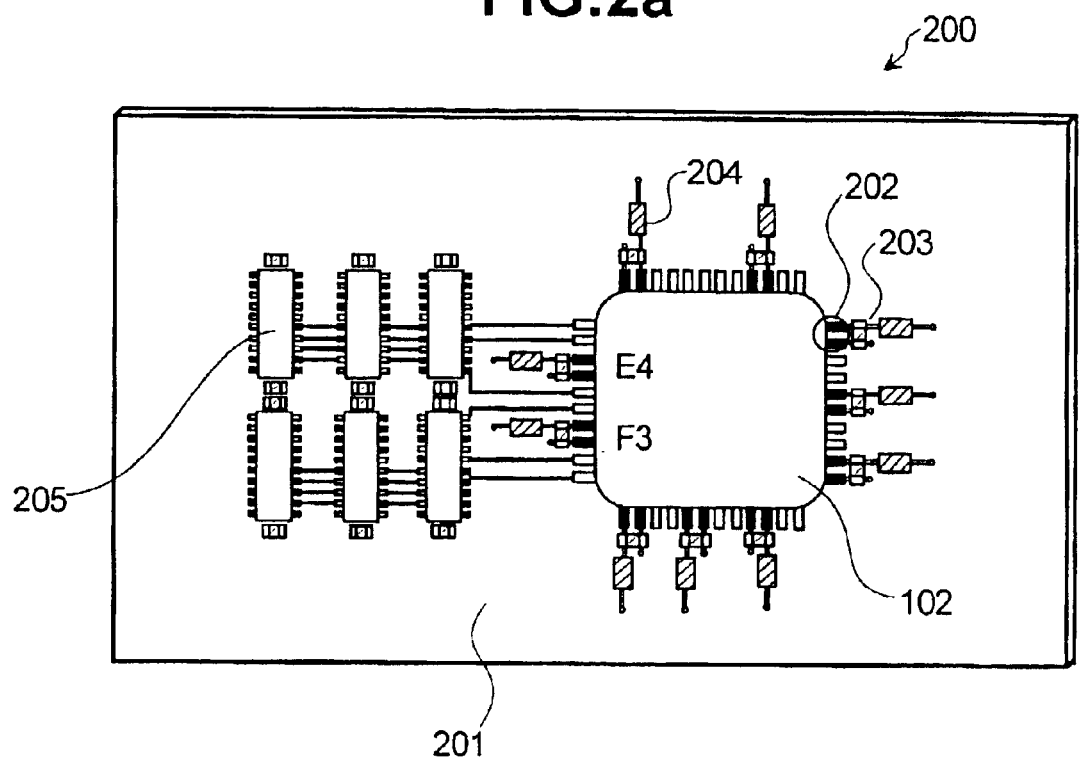
FIGS. 2a and 2b depict diagrams illustrating a state of a semiconductor device packaged on a packaging substrate.

FIG. 2a depicts a device or module 200 including the microprocessor 102 and memories 205 packaged on a substrate or circuit board 201. Conventional data sheets of FIGS. 14 to 16 describe the module 200.

Figure 2B:
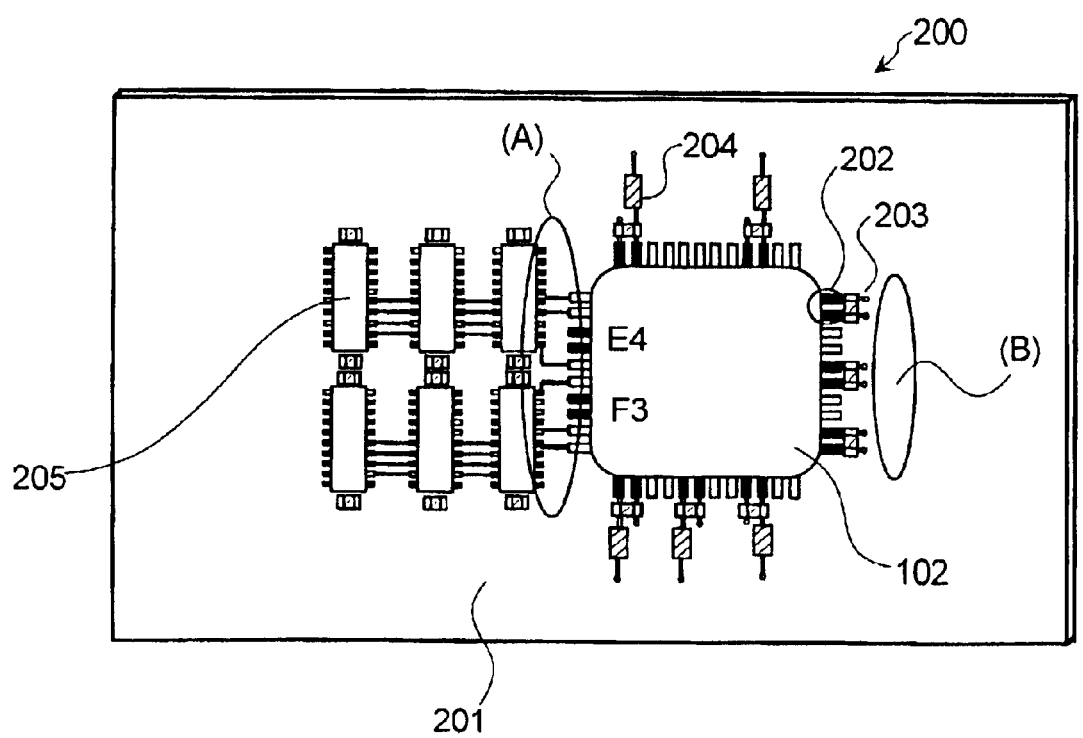

In FIGS. 2a and 2b, the module 200 includes the substrate 201, power/GND terminals 202 of the microprocessor 102, a bypass capacitor or condenser 203 packaged for stabilizing the potential of the power/GND terminals 202, an EMI filter 204 packaged for preventing a high-frequency current from leaking from the terminals 202 to the substrate 201, and the memories 205.

As used herein, the term "power terminal" refers to a terminal having a function relating to power. Accordingly, the term "power terminal" is used to refer to a terminal that is coupled to a power supply (i.e., a power supply terminal) and a terminal that is coupled to the ground (i.e., a ground or GND terminal). The EMI filters and the bypass capacitors are used to suppress or handle signal noises, e.g., EMI noise or simultaneous switching noise. As such, these components and others (e.g., decoupling inductors) that are used to suppress or handle signal noises are referred to as "noise suppression components," "suppression components," "noise countermeasure components," or "counter measure components." These terms are used interchangeably herein.

In the traditional data sheets, the power supply noise intensity or noise level classification (also referred as "counter measure priority") for the power terminals 202 are unknown for the microprocessor 102 to be installed on the substrate 201. Thus, the bypass condenser 203 and the EMI filter 204 are provided for all power terminals 202 as a precautionary measure even though some power terminals do not need such noise suppression components. These additional suppression components hinder the efforts to increase the device density in the substrate 201 to reduce the manufacturing costs.

FIG. 2b depicts the module 200 including the microprocessor 102 and the memories 205, where the electrical characteristics of the power/GND terminals of the microprocessor 102 are made available (FIG. 1).

In this case, the terminals 103 having the terminal numbers E4 and F3 and terminal names VSSQ and VDDQ in the data sheet 101 are denoted as power terminals 202. When the power supply noise intensities 107 of the power terminals 202 are indicated to be very small (a, d<b, c) in the data sheet 101, the bypass condenser 203 or EMI filter 204 does not need to be provided for the terminals 202. Accordingly, a fewer number of the suppression components is used in the module 200 of FIG. 2b when compared to that of FIG. 2a, thereby enabling the packaging density to be increased at an area (A). Similarly, eliminating the use of the EMI filter 204 for the terminals 202 having a low power supply noise intensity can also increase the packaging density in an area (B).

In this manner, in one embodiment of the present invention, the data sheet is used to provide information about the power supply noise intensity 107 in the power/GND terminals 202 of the semiconductor device, such as the microprocessor 102 being assembled to the circuit board 201, so that the suppression components are provided for only those terminals that actually need them. Consequently, less time is needed to assemble the microprocessor 102 to the circuit board 201.

Furthermore, when the power/GND terminal 202 whose terminal name is G3 in FIG. 1 has a greater power supply noise intensity 107 than the other power/GND terminals 202, this information is provided in the data sheet 101 for use in a module assembly according to one embodiment of the present invention. Using this information, the suppression components of appropriate capacities may be used for particular terminals. For example, a bypass condenser 203 having a larger capacitance may be used with a terminal that has a higher noise level and that having a smaller capacitance may be used for a terminal that has a lower noise level. The above method shortens the time needed to perform EMI countermeasures in installing the microprocessor 102 to the substrate 201.

In one embodiment, the power supply noise intensity 107 has been expressed using voltage values to provide information about the power supply noise intensity. However, similar information may be conveyed using current values, electric power values, magnetic field intensity information, and/or electric field intensity information.

The power supply noise intensity 107 is provided for a plurality of operating frequencies since the semiconductor device may be used at different frequencies. As known by those skilled in the art, the same effect can be provided using the description of time waveforms or wavelets.

Figure 3:
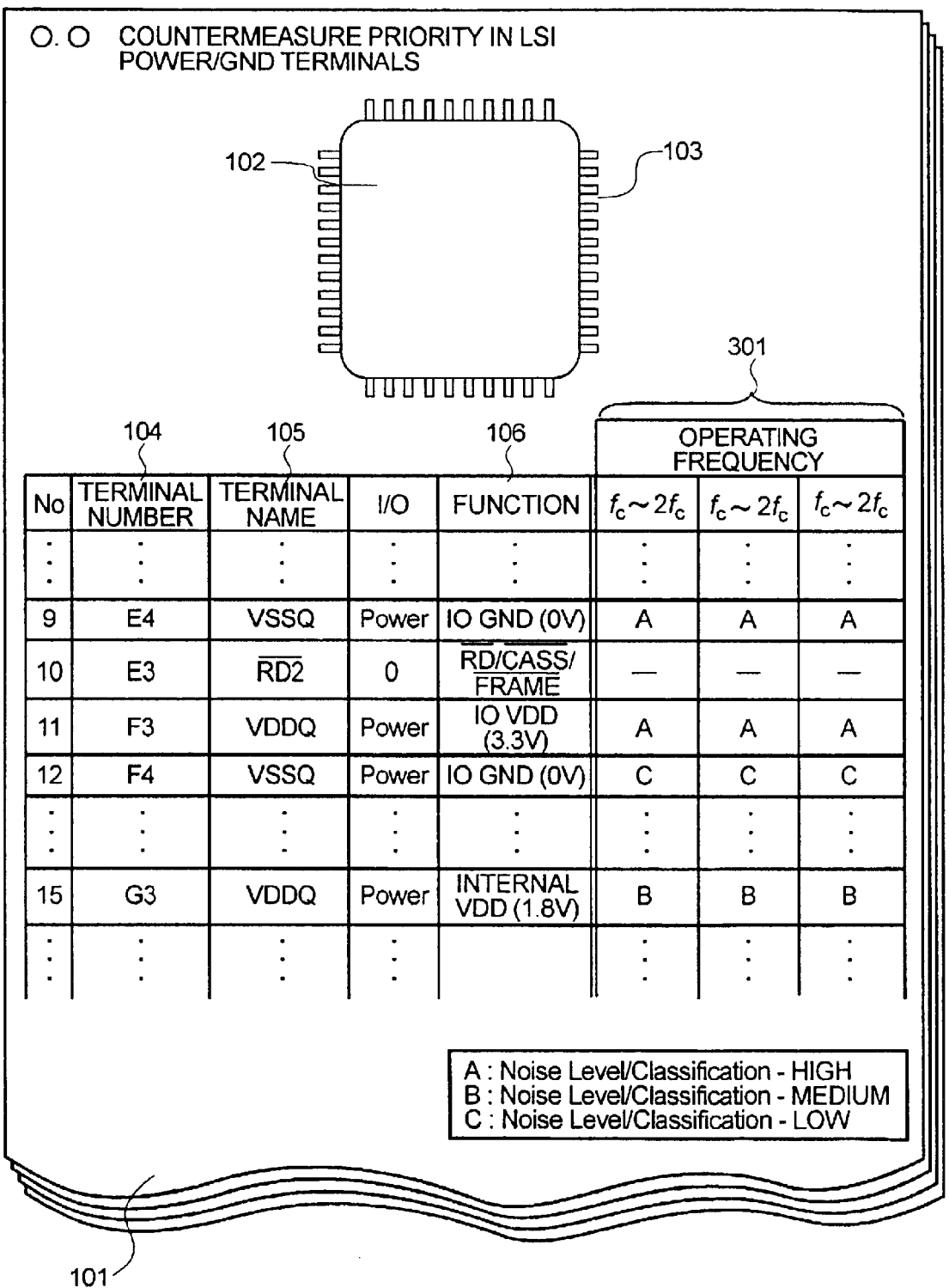
FIG. 3 depicts a diagram illustrating one example of a data sheet for reporting information about electrical characteristics at predetermined power supply terminals of a semiconductor device.

FIG. 3 depicts a diagram illustrating a data sheet reporting information about the countermeasure priority or noise level classification for use in performing noise countermeasures for reducing electromagnetic interference in the power terminals. A column 301 provides information about the noise levels of the terminals. Each terminal is classified into one of a plurality of classes according to its noise level, where the marking A denotes a high noise level, the marking B denotes a medium noise level, and the marking C denotes a lower noise level. This noise information and/or other information that categorizes noise information are referred as "noise level classification." In one embodiment, as shown in FIG. 3, each terminal is provided with the noise level classification for a plurality of operating frequencies since the semiconductor device 102 may be used in different operating frequencies according to the module 200.

As with the power supply noise intensity 107 of FIG. 1, the information provided by the noise level classification above may be used to provide suppression components for only those terminals that actually need them. For example, suppression components may be provided for only terminals that are marked with "A" or "B", but for those that are marked with "C." Accordingly, the noise level classification may be used to increase the device density of the module 200 and reduce assembly time thereof.

Figure 4:
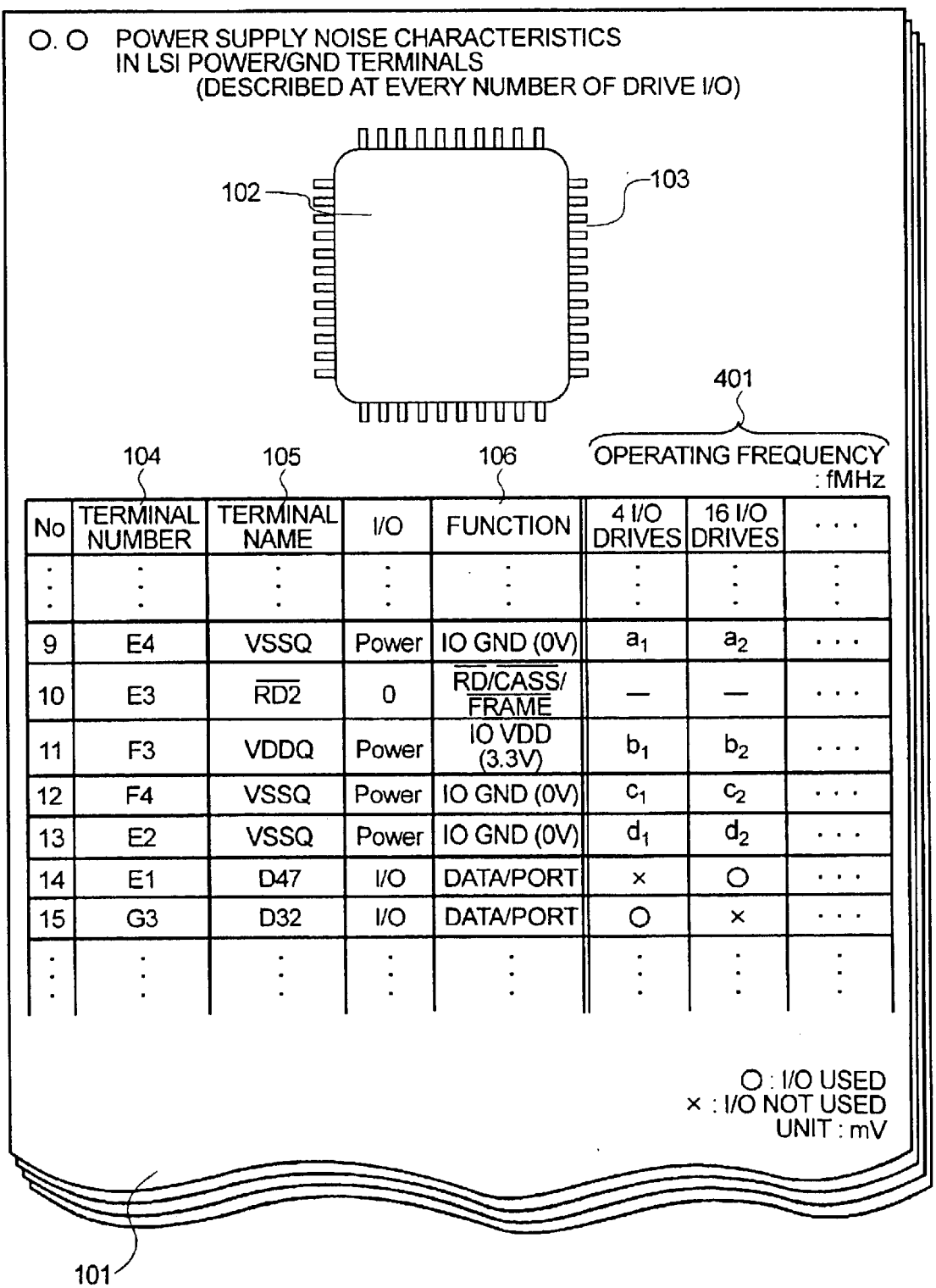
FIG. 4 depicts a diagram illustrating one example of a data sheet for reporting information about electrical characteristics at predetermined power supply terminals of a semiconductor device.

FIG. 4 depicts a data sheet with the power supply noise intensity 107 or noise level classification 401 described for the number of I/O drives on predetermined power terminals of the semiconductor device, e.g., the microprocessor 102.

As shown in FIG. 4, even though the electric characteristics of the power/GND terminals 202 of the microprocessor 102 are changed to the description of the number of I/O drives in the microprocessor 102, the above described methods of providing the power supply noise intensity 107 or the noise level classification may still be provided in a data sheet for use in assembling a module using the microprocessor 102. As explained below, the electrical characteristics of terminals provided in the data sheet can be used to obtain a higher packaging density at lower cost, as well as a shorter time for performing the EMI countermeasures.

Furthermore, in FIGS. 1, 3, and 4, resonance frequencies inherent in each package of the semiconductor device 102 are described as well as information about the power supply noise intensity 107 or the noise level classification in the power/GND terminals 202.

Embodiment 2

Figure 6:
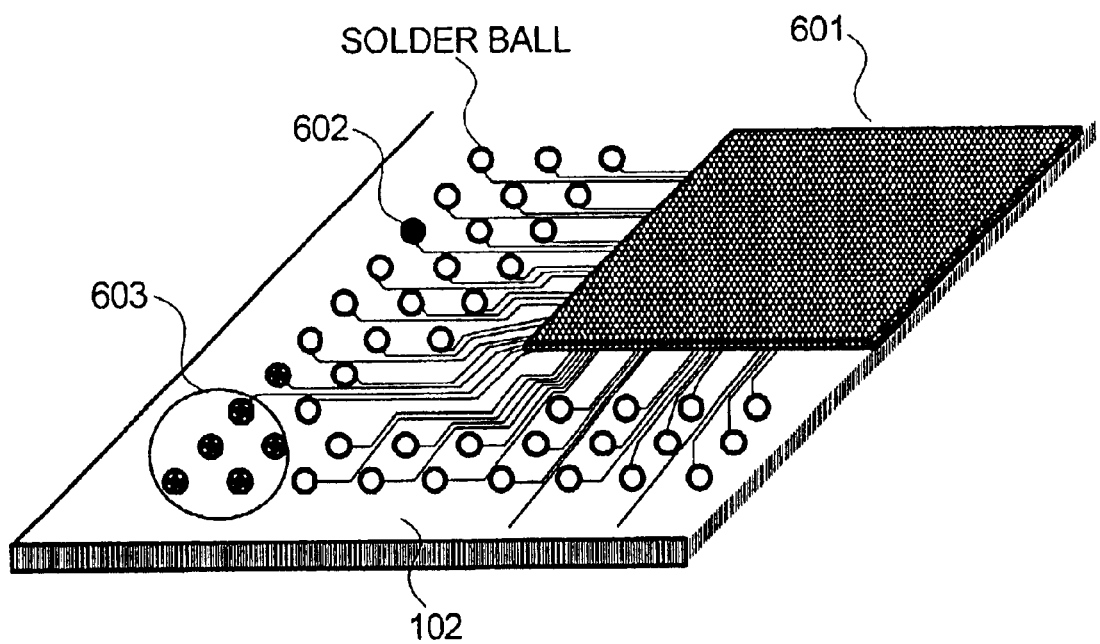
FIG. 6 depicts a diagram illustrating a BGA semiconductor device with a predetermined power/GND terminal that includes a marking.

FIG. 6 depicts a method of providing information about the power/GND terminals 202 having high power supply noise intensities 107 or high noise level classification 301 by color coding or marking the power/GND terminals 202 of the microprocessor 102. That is, the power terminals of the microprocessor are provided with indications providing information about noise associated with the power terminals, i.e., the noise information.

In FIG. 6, the microprocessor 102 includes a semiconductor chip 601, a numeral 602 denoting a color-coded marking provided adjacent a power/GND ball to indicate that the terminal in question has a high noise level, a numeral 603 denoting a group of color-coded markings provided adjacent respective power/GND balls to indicate the terminals that have high noise levels. FIG. 6 illustrates a quarter of a packaged semiconductor device.

Figure 7:
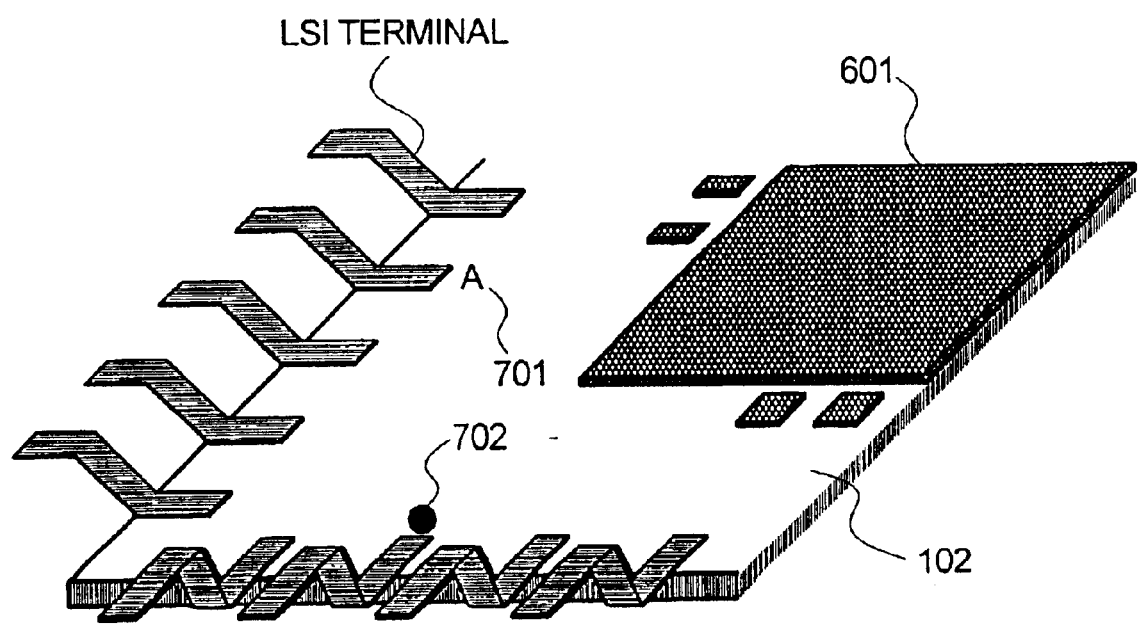
FIG. 7 depicts a diagram illustrating a QFP semiconductor device with a predetermined power/GND terminal that includes a marking.

FIG. 7 depicts another method of providing information on the noise levels of the power terminals of the microprocessor 102.

In FIG. 7, a mark 701 denotes the noise level classification of the terminal 202. A color-coded mark 702 also denotes the noise level classification of one of the power terminals 202. For example, a red mark indicates a high noise level, a yellow mark indicates a medium noise level, and a green mark indicates a low noise level. Alternatively, a mark is provided adjacent to only those terminals that have sufficiently high noise level to require a suppression component. FIG. 7 illustrates a quarter of a packaged semiconductor device.

Figure 10A:
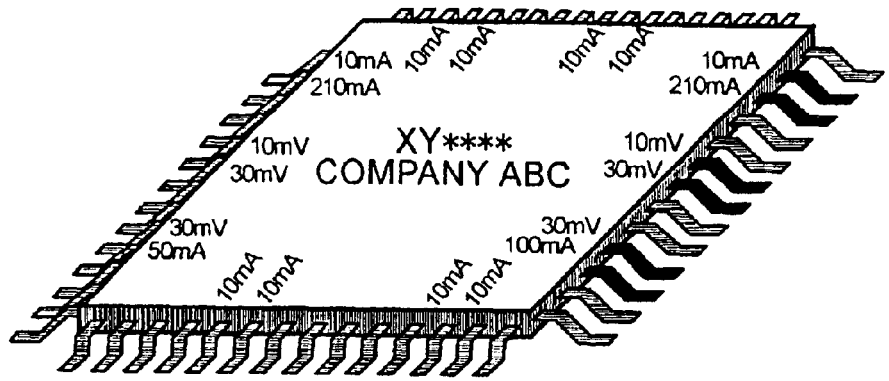
FIGS. 10a, 10b, and 10c depict diagrams illustrating a semiconductor device having power supply noise intensity information provided on its package.
Figure 10B:
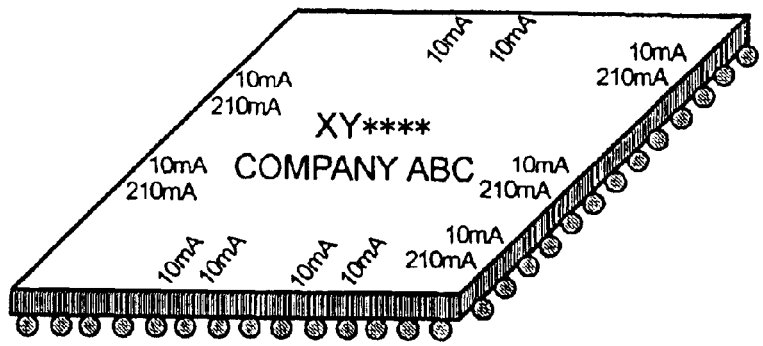
Figure 10C:
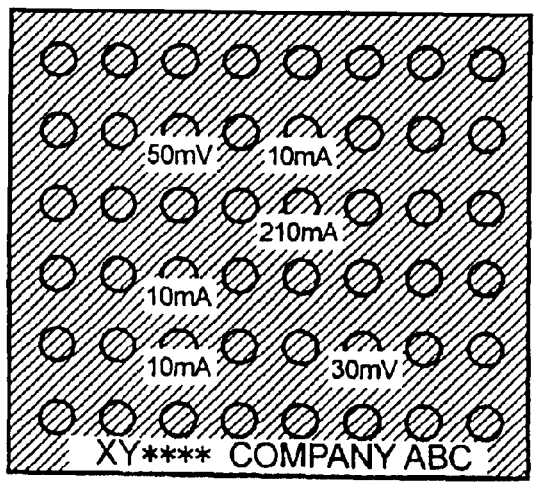
Figure 11A:
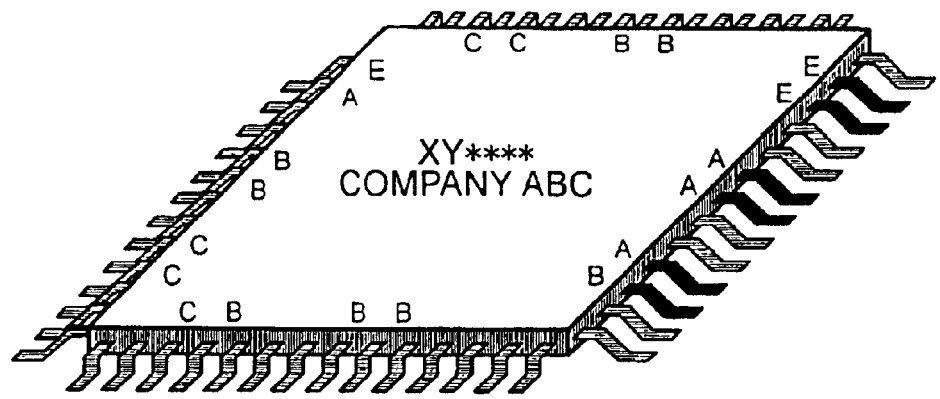
FIGS. 11a, 11b, and 11c depict diagrams illustrating a semiconductor device having noise level classification information provided on its package.
Figure 11B:
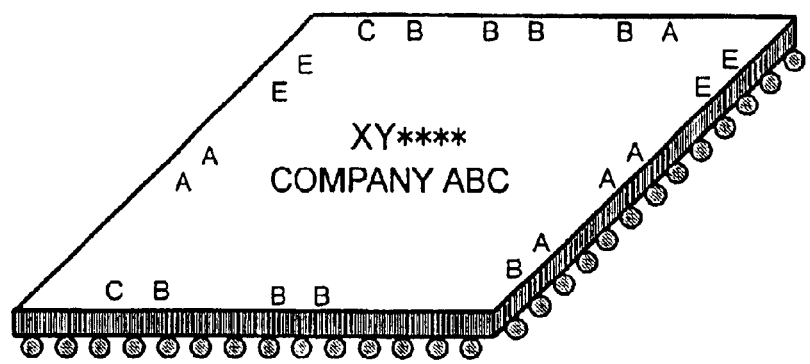
Figure 11C:
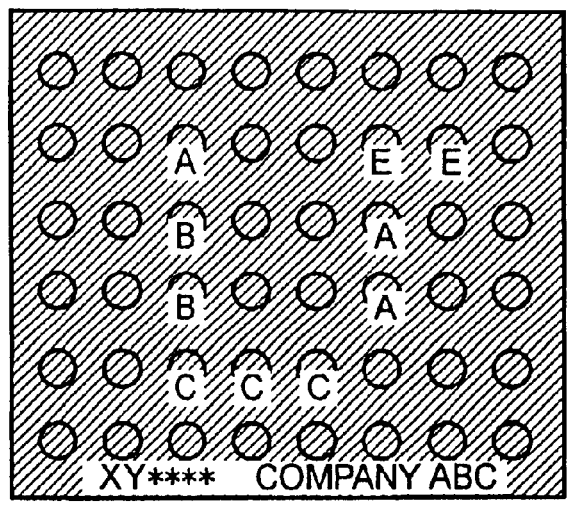

Furthermore, as shown in FIGS. 10a to 10c, for example, the power supply noise intensity or values may be printed on a resin-molded semiconductor device package. Similarly, as shown in FIGS. 11a to 11c, the noise level classification may be printed on a resin-molded semiconductor device package. The information about the power supply noise intensity or noise level classification is printed on the package surface with a company name and a product number at the same time according to one embodiment of the present invention.

In addition, the noise information provided on the package of the semiconductor device may be referred when the assembled circuit board having the semiconductor device undergoes the power supply noises or electromagnetic interference simulations.

Without the noise level markings of FIGS. 6, 7, 10a to 10c and 11a to 11c, the power/GND terminals 202 having high noise levels cannot be easily determined. Consequently, the suppression components, e.g., the bypass condenser 203 and the EMI filter 204, have to be inserted to all the power/GND terminals 202 as a precautionary measure, as shown in FIG. 2a. Therefore, the above embodiments of the present invention facilitate increasing the packaging density and reducing the number of suppression components used for the module. This reduces the manufacturing cost and shortens the time needed for the noise countermeasure procedure.

FIGS. 6 and 7 depicts the semiconductor devices having ball grid array (BGA) and quad flatpack package (QFP) formats. However, the present embodiment may also be used with other package formats, e.g., flip chip BGA or pin grid array (PGA), Dual Inline Package (DIP), or Small Outline Package (SOP). Similarly, the implementations illustrated in FIGS. 10 and 11 also are not package format specific and may be used in many different formats.

Embodiment 3

Figure 8:
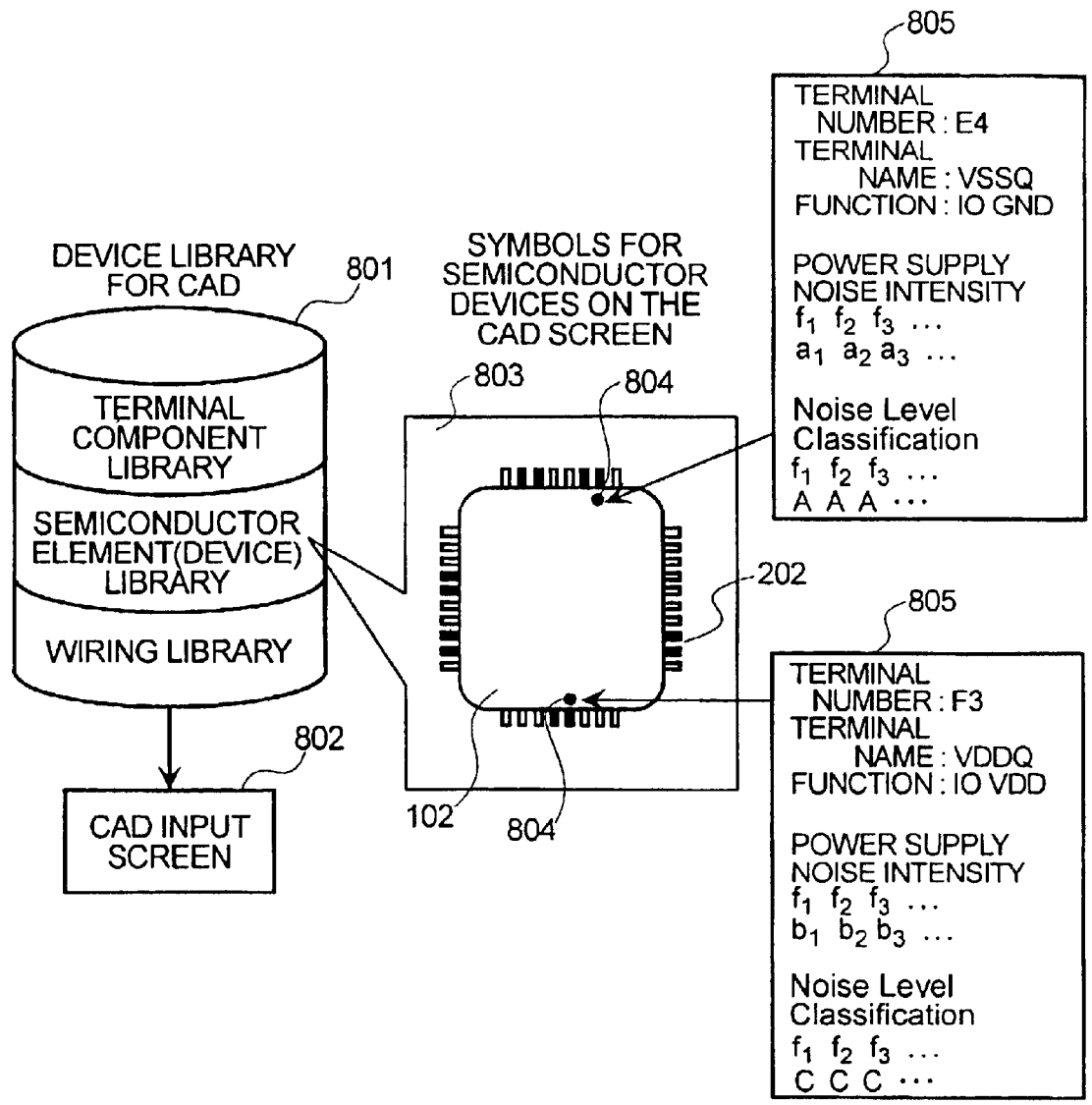
FIG. 8 depicts a diagram illustrating symbols of a semiconductor device on a CAD layout program having information about the power supply noise intensity or noise level classification.

FIG. 8 depicts a computer aided design (CAD) system having noise level information on the semiconductor device 102 according to one embodiment of the present invention.

In FIG. 8, a numeral 801 denotes a device library (data base) of terminal components or semiconductor devices for use in designing the substrate layout with a CAD system. A numeral 802 denotes a CAD input screen for performing a layout of the substrate 201 using various device symbols from the device library 801. A numeral 803 denotes a semiconductor device symbol that has been selected from the device library 801 and displayed on the CAD input screen 802. A numeral 804 denotes a marking that indicates that a terminal has a high noise level. A numeral 805 denotes terminal information windows providing noise level information (the noise intensity 107 or the noise level classification 301) for the terminals in the semiconductor device symbol 803.

Traditionally, when the layout CAD is used to perform the layout of the substrate 201 including the microprocessor 102 and memories 205 shown in FIG. 2a, the layout is performed to provide suppression components for all power terminals since it is unknown which terminals have high noise levels. Therefore, the packaging density is reduced and the number of components is also increased, thereby leading to cost increases. Additionally, the entire components have to be placed and routed inside the substrate 201 with a limited area, causing a prolonged period of time for substrate layout.

However, as in the embodiment shown in FIG. 8, the layout CAD screen 802 displays the noise information (e.g., the power noise intensity 107 and the noise level classification 301), associated with the power/GND terminals 202 in the form of marks or numbers. This information can be used to reduce the number of suppression components to provide a more compact device at a lower cost. Furthermore, detailed information about the power/GND terminals 202 in the semiconductor device symbol 803 can be obtained from the terminal information windows 805.

For example, when it is known from the terminal information windows 805 that a first power terminal 202 (terminal number E4) has a small power supply noise intensity 107 and a second, neighboring terminal 202 also has a small power supply noise intensity 107, the layout and routing can be performed on the CAD input screen 802, such that the second power terminal near the first power terminal (terminal number E4) are combined and then connected to a single bypass capacitor 203, thereby reducing the number of capacitors used.

In this manner, the marks 804 for the power/GND terminals 202 in the semiconductor device symbol 803 or the terminal information windows 805 are utilized on the CAD input screen 802, whereby the high-density packaging in the substrate 201 can be realized at low cost, and a shortened period of time for noise countermeasures can also be realized.

It is advantageous that the number of reference to the data sheet of the semiconductor device 102 can be reduced as much as possible during the layout phase, so that the layout is performed while viewing the CAD input screen.

The third embodiment above illustrated above enables a designer (user) to perform the substrate layout based on the noise information denoted in the semiconductor device symbol to optimize the substrate layout design when the designer performs the substrate layout using a CAD system.

In addition, the substrate layout design may be optimized based on the power supply noise information described in the semiconductor device symbol on CAD such that a warning message is displayed on the screen 802 when a suppression component is not provided for a terminal with high noise level. Similarly, a message to remove a suppression component is displayed on the screen 802 if the component is erroneously provided for a terminal that has a low noise level.

Figures 13, 14:
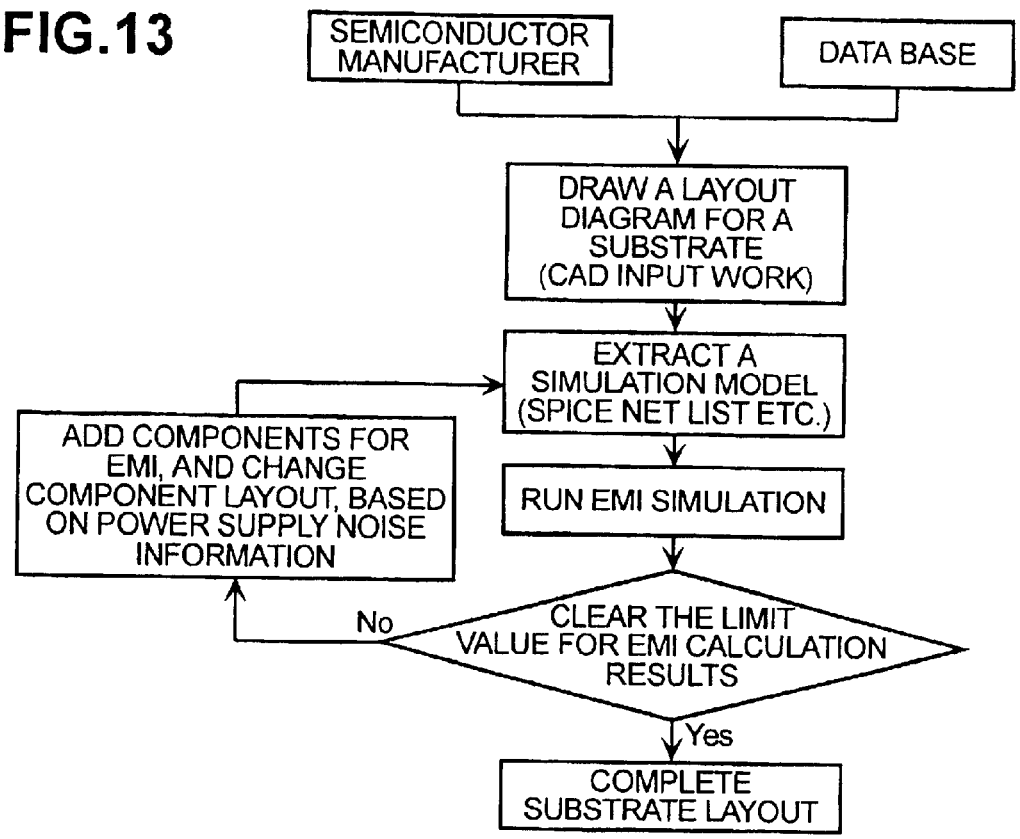
FIG. 13 depicts a flow chart illustrating substrate design processes using information about the power supply noise intensity or noise level classification of a semiconductor device.
FIG. 14 depicts the maximum rating of a semiconductor device described in a traditional data sheet.
Figure 19:
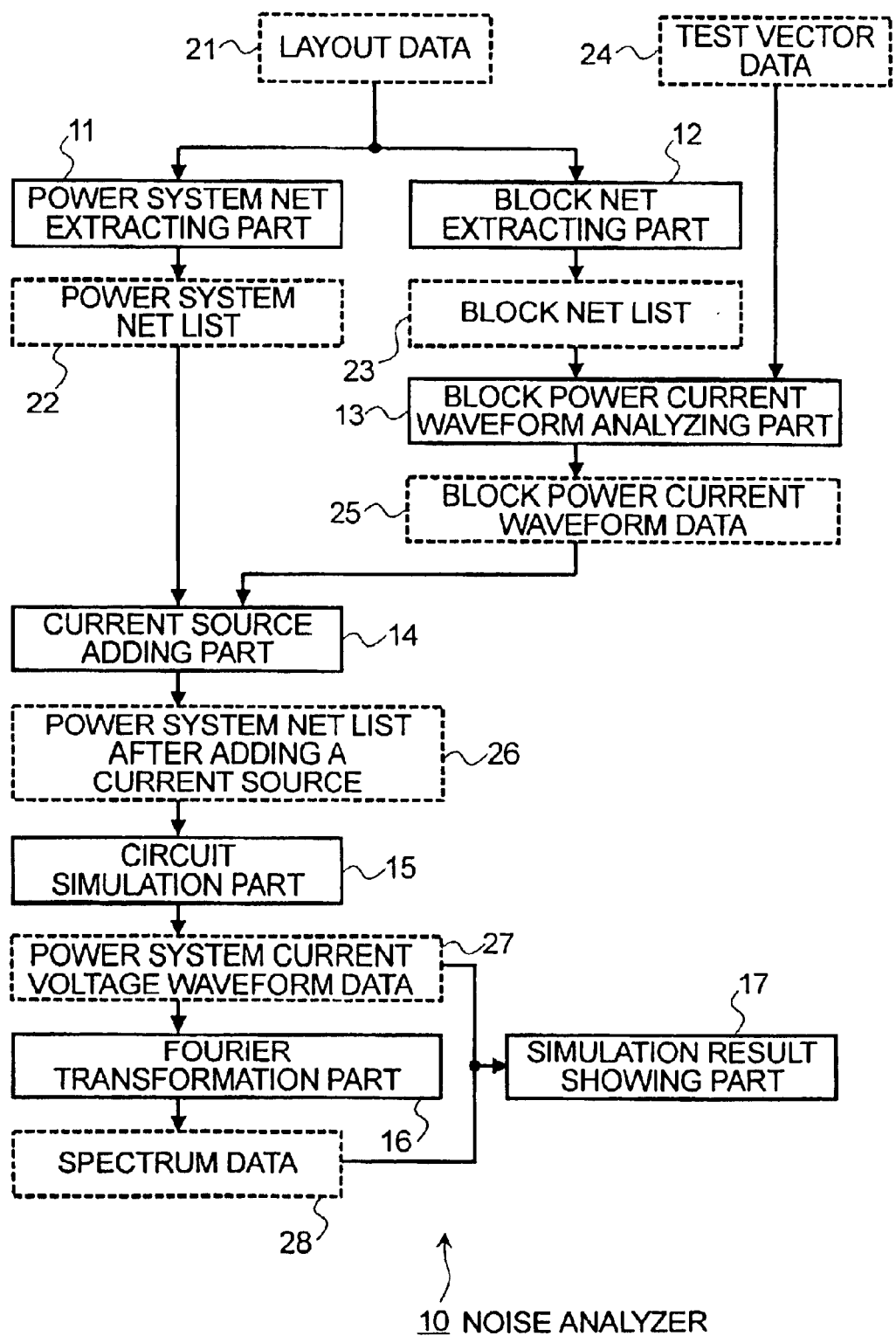
FIG. 19 depicts a block diagram illustrating a functional configuration of a noise analyzer.

Furthermore, based on the power supply noise intensity information described in the semiconductor device symbol, the electromagnetic interference is calculated from the layout design prior to actual implementation. When the magnitude of the calculated electromagnetic interference is below a threshold level, the device is assembled according to the layout design. If the noise is greater than the threshold level, the layout design is modified, e.g., by adding additional suppression components at appropriate places. FIG. 13 shows a flowchart of using the noise information of the terminals to perform a device layout design according to one embodiment of the present invention.

Embodiment 4

Next, a system and method for providing the power noise information described in the semiconductor device symbol for users are described with reference to FIG. 12.

A route (i) shown in FIG. 12 indicates a method of transmitting the noise information of the semiconductor device symbol to a user from a semiconductor manufacturer or semiconductor property tester in a form of catalogues or electronic data. Subsequently, with this noise information, the user uses a CAD system to calculate the electromagnetic interference of a device layout design.

In one embodiment, in a route (ii) shown in FIG. 12, a user accesses the data base including the noise information of the semiconductor device symbol provided by a semiconductor manufacturer or semiconductor property testing manufacturer via the Internet to obtain the noise information. Then, with the power supply noise intensity information, the electromagnetic interference of the layout design is computed to obtain an optimal design.

In one embodiment, users themselves may perform simulations using the power supply noise intensity information of the semiconductor device, the routing of a packaging substrate and the information about electronic components including suppression components to be connected to the semiconductor device, or send the information to simulation servers (simulation machines) provided by the semiconductor manufacturer, semiconductor property tester or other companies for simulated calculation results.

Accordingly, the layout of a device can be performed in a relatively a short time, and the small, compact device can be realize at a relatively low cost.

Figure 5:
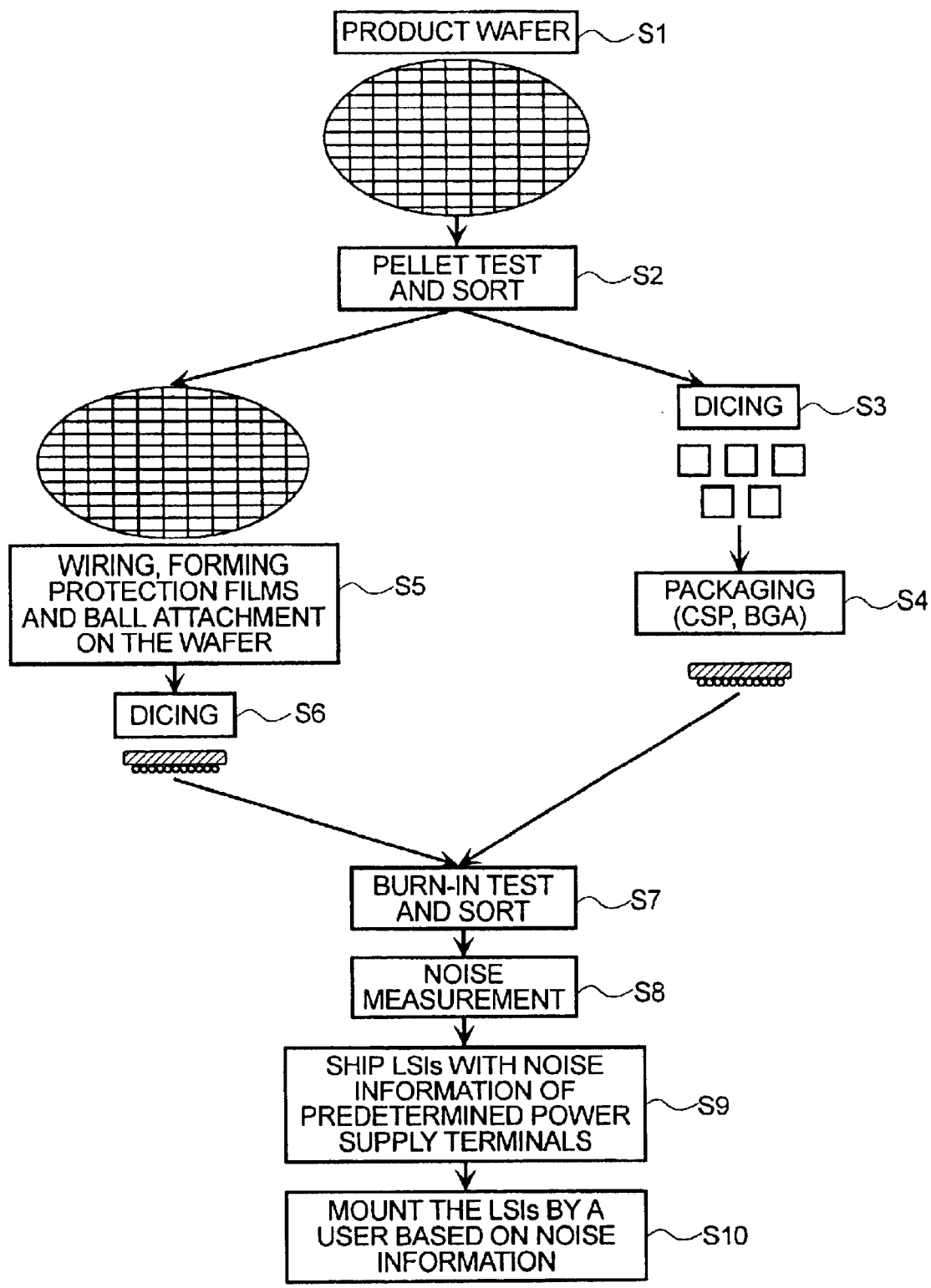
FIG. 5 depicts a diagram illustrating fabrication processes of a semiconductor device.

FIG. 5 depicts a diagram illustrating fabrication processes of the semiconductor device according to embodiments of the present invention. In FIG. 5, wafers fabricated in the course of step S1 undergoes the initial defect sort in the pellet test at step S2. Then, the non-defective wafers are processed according to step S3 or S5 depending on the implementation. At step S3, the product wafer is diced and non-defective chips are packaged into CSP (Chip Size Package) or BGA (Ball Grid Array) chips at step S4. Then, the chips are processed according to step S7. On the other hand, at step S5, wiring patterns or protective films are formed, and solder balls are attached on the wafer collectively. Subsequently, at step S6, the wafer formed with the wiring patterns is separated into semiconductor chips or devices. In one embodiment, the step S5 is performed to make a wafer level chip size package (CSP) that does not include a protective plastic resin to make very small semiconductor devices. Accordingly, the dicing step S6 is performed after the wiring and formation of solder balls in the step 5. After that, at step S7, the semiconductor devices obtained from step S4 or S6 undergo the burn-in test for the final sort. Then, non-defective devices are further processed at step S8.

At step S8, the semiconductor devices are mounted on a predetermined test substrate to test the electrical characteristics of power/GND terminals of the semiconductor device in predetermined operations, and go to step S9. These electrical characteristics are the noise information described above, e.g., the power supply noise intensity 107 and the noise level classification 301.

At step S9, the test results of the electrical characteristics are written in a recording medium such as a data sheet, or denoted by marks near pins of the semiconductor device or by color-coding of solder balls, or printed on the semiconductor device package of each device, or stored in a computer readable medium (e.g., a device library for CAD), or a combination thereof. Then, the semiconductor devices are shipped out.

At step S10, a user designs the module 201 using the noise information of the semiconductor device.

In one embodiment, the electrical characteristic test is performed for a representative device, e.g., one semiconductor device per type, one semiconductor device per lot, or a plurality of semiconductor devices per lot for average noise information. In such a case, the step S8 is skipped for most semiconductor devices, and the noise information may be written on the package during the packaging step, e.g., in the step S4.

Embodiment 5

Figure 9A:
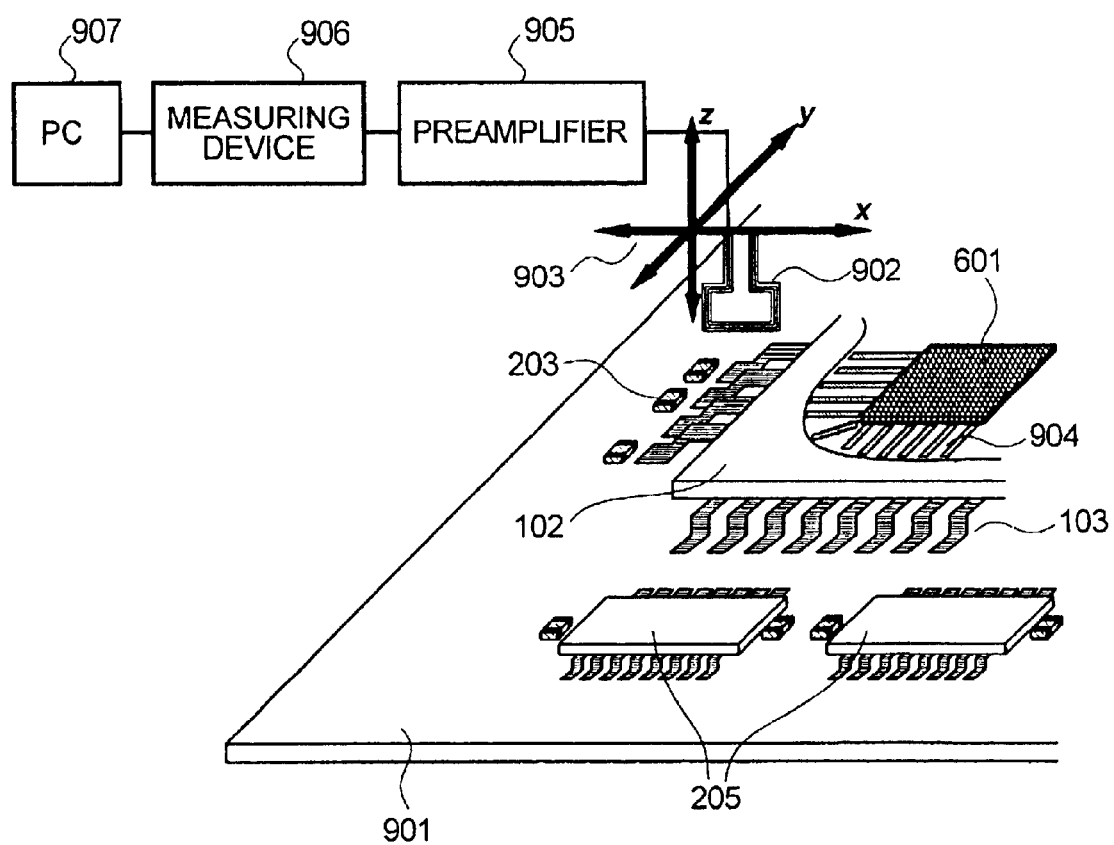
FIGS. 9a–9k depict diagrams used to illustrate an exemplary method of testing noise intensity of a semiconductor device.

Next, a method for testing the noise intensity in the power/GND terminals 202 of the semiconductor device 102 shown at step S8 in FIG. 5 will be described. FIG. 9A depicts a diagram illustrating a method determining the power supply noise intensity 107 in the power/GND terminals 202 of the semiconductor device 102 shown at step S8 in FIG. 5.

In FIG. 9A, a numeral 901 denotes a test substrate designed to replicate an actual operational condition to measure the power supply noise intensity 107 in the power/GND terminals 202 of the semiconductor device 102. A numeral 902 denotes a magnetic field antenna for measuring magnetic field distributions near the semiconductor device 102. A numeral 903 denotes a stage for moving the magnetic field antenna 902. A numeral 904 denotes bonding wires for connecting a semiconductor chip 601 to the terminals 103 in the semiconductor device 102. A numeral 905 denotes a preamplifier for amplifying voltage induced in the antenna 902. A numeral 906 denotes a measuring device for measuring voltage induced in the antenna 902. A numeral 907 denotes a computer for processing and storing data measured by the measuring device 906.

Next, the operations will be described. The stage 903 moves the magnetic field antenna 902 above the vicinity of the terminals 103 of the semiconductor device 102. The preamplifier 905 amplifies the voltage induced in the antenna 902 due to the magnetic field distributions near the terminals 103 of the semiconductor device 102. The computer 907 receives values measured by the measuring device 906. At this time, the computer 907 also receives the position coordinates of the antenna 902 along with the voltage values induced in the antenna 902 for storage. The measuring device may be a spectrum analyzer capable of measuring only voltage intensities in the frequency domain or a vector voltmeter capable of measuring voltage intensities and phases against reference signals (sine waves). The voltage values induced in the antenna 902, which are stored in the computer 907 are converted to values of magnetic field intensities using a predetermined equation for conversion. Based on the measurement results of the magnetic field intensities, power/GND terminals having a great power supply noise intensity or power/GND terminals having a high noise level classification can be identified. Furthermore, in the semiconductor device before resin-molding, magnetic field distributions near bonding wires for connecting the semiconductor chip to the terminals or near TAB wiring are measured, whereby power/GND terminals having a great power supply noise intensity or power/GND terminals having a high noise level classification can also be identified.

Moreover, to identify power/GND terminals having a great power supply noise intensity or power/GND terminals having a high noise level classification more accurately, current distributions generating the magnetic field distributions are computed from the measurement results of magnetic field distributions, whereby power/GND terminals having a great power supply noise intensity or power/GND terminals having a high noise level classification may be identified.

An inverse operation of the current distributions from the measurement results of the magnetic field distributions is thus allowed:

(1) three-dimensional magnetic field distributions are measured to determine the probability of the existence of the current that is a wave source to generate the magnetic field distributions for the positions of the current; or (2) the measurement results of the magnetic field distributions in a two-dimensional plane undergo the complex Fourier transform in space and a δ function is folded thereinto and integrated, whereby the position of narrow-pitched current can be determined.

For example, in technique (2), the near magnetic field above the bonding wires of the LSI or package terminals is measured at a pitch of 10 μm, whereby the position of current can be determined at a resolution of 20 μm.

Besides, to enhance the resolution of the magnetic field distribution measurement itself, a microcoil of 20 μm in wiring width and 20 μm in wiring pitch is produced using the fabrication method of the build-up substrate or semiconductor processes. It provided about 10 μm above the semiconductor device, thereby enhancing the resolution of the magnetic field distribution measurement up to 20 to 30 μm. In addition, the current position is calculated back from the magnetic field distributions measured by the magnetic field antenna in high resolution, whereby accuracy in the inverse operation of the current position can also be improved.

Furthermore, for the test substrate for testing the power supply noise intensity and the noise level classification in the power/GND terminals of the semiconductor device, those conformed to the specifications of power supply noise evaluation boards for the semiconductor devices standardized in the IEC (International Electrotechnical Commission) may be used, or test substrates standardized in the specifications of specific users may be used.

Figure 9B:
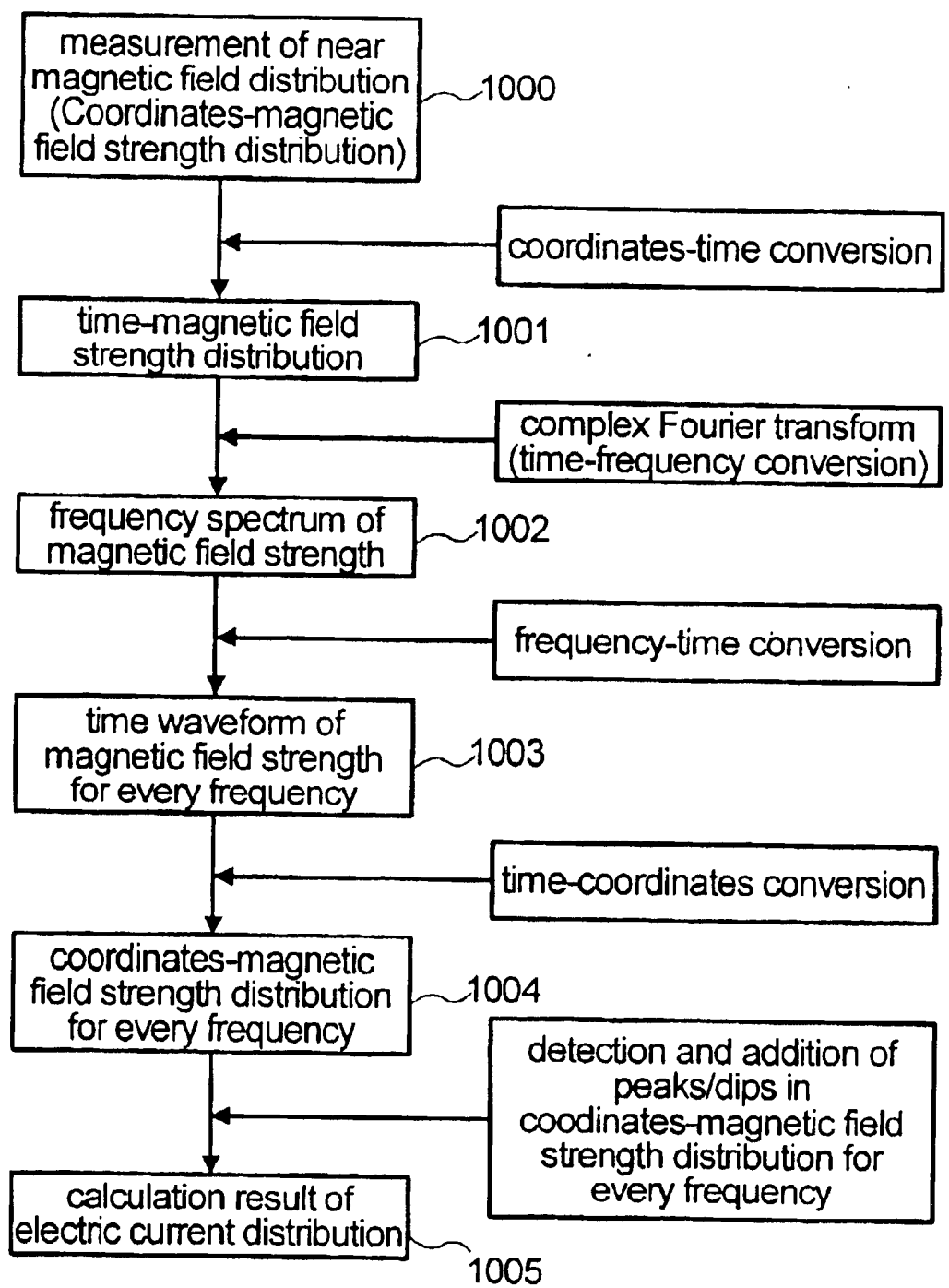
Figure 9C:
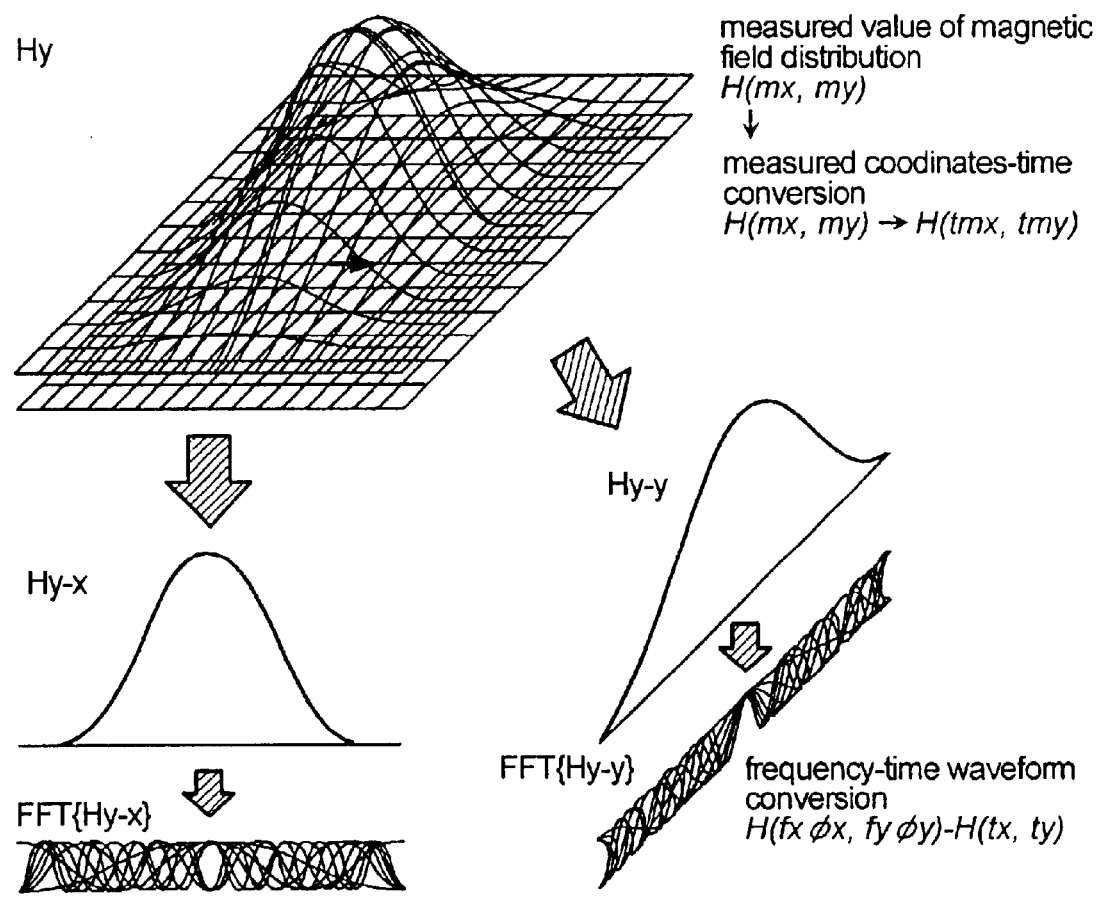
Figure 9D:
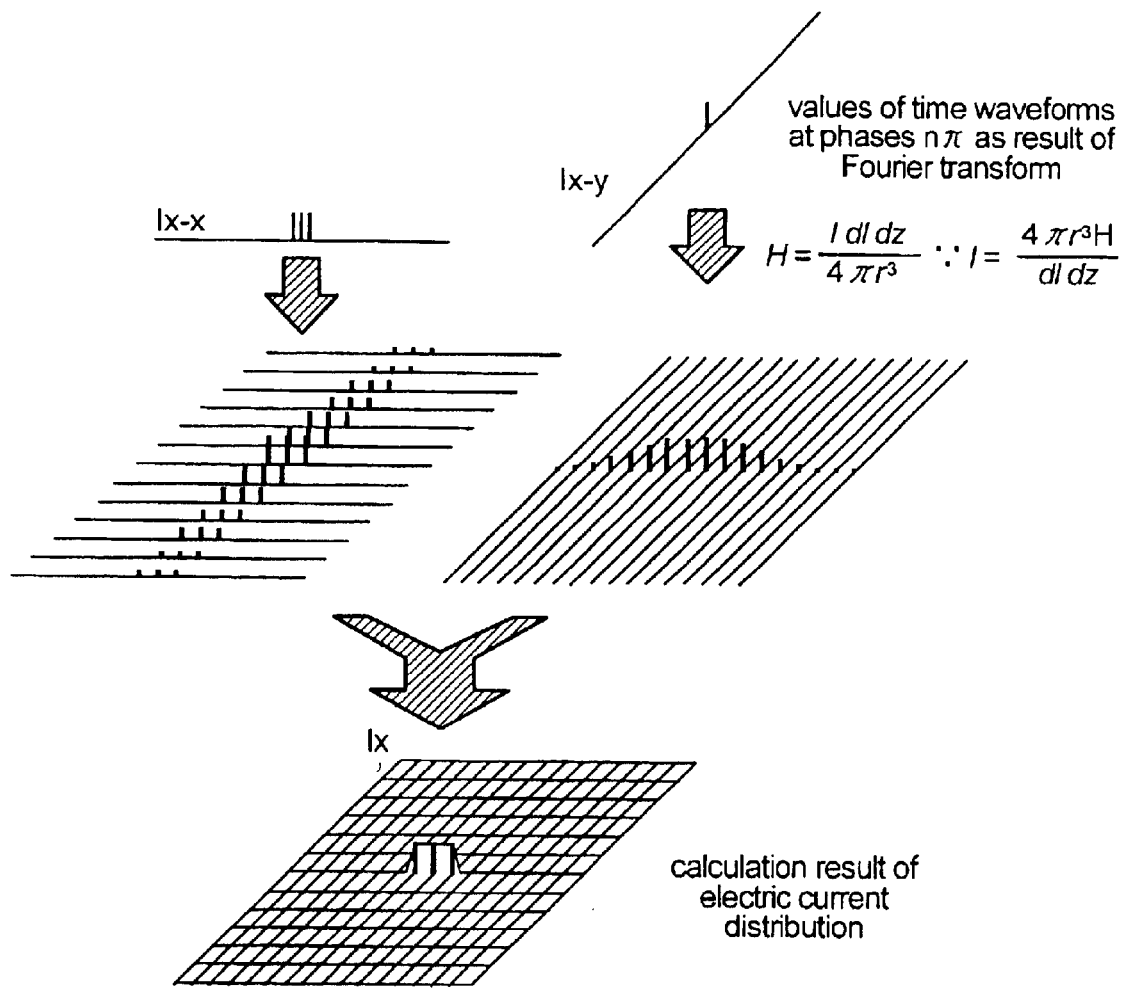

FIGS. 9B–9K illustrate in more detail a method for probing the power terminals of the semiconductor device for noise information according to one embodiment of the present invention. FIG. 9B shows a flowchart on an analyzing method of an electromagnetic wave source probing, while FIGS. 9C and 9D visually illustrate the analyzing method.

First of all, a magnetic field distribution 501 in the vicinity of an object to be measured (a power terminal) is measured (step 1000). An exemplary measured result is represented as Equation 1.

$$\begin{cases} H_x(m_x, m_y) = \sum_{n_x=0}^{N_x} \sum_{n_y=0}^{N_y} \frac{I_y(n_x, n_y) \cdot dsy}{4\pi r_{mn}^2} \cdot \frac{dz}{r_{mn}} \\ H_y(m_x, m_y) = \sum_{n_x=0}^{N_x} \sum_{n_y=0}^{N_y} \frac{I_x(n_x, n_y) \cdot dsx}{4\pi r_{mn}^2} \cdot \frac{dz}{r_{mn}} \end{cases} \quad [\text{Equation 1}]$$

where Nx: number of estimated points of electric currents in x direction;

Ny: number of estimated points of electric currents in y direction;

nx: x coordinate of position where electric current is present;

ny: y coordinate of position where electric current is present;

Mx: number of magnetic field measuring points in x direction;

My: number of magnetic field measuring points in y direction;

mx: x coordinate of magnetic field measuring position;

my: y coordinate of magnetic field measuring position;

ds: interval between positions where electric currents are estimated;

dsx: interval between positions in x direction where electric currents are estimated;

dsy: interval between positions in y direction where electric currents are estimated;

dp: magnetic field measuring interval;

dpx: interval in x direction for magnetic field measurement;

dpy: interval in y direction for magnetic field measurement;

rmn: distance between n-th electric current position and m-th magnetic field measuring point;

c: speed of light;

tm: propagation time from magnetic field measuring origin;

tmx: time necessary for propagating by x direction distance from magnetic field measuring point;

tmy: time necessary for propagating by y direction distance from magnetic field measuring point;

φx(mx,my): phase at (mx,my) when each frequency component propagates in the x direction from an origin as a result of performing the Fourier transform; and φy(mx,my): phase at (mx,my) when each frequency component propagates in the y direction from an origin as a result of performing the Fourier transform.

Subsequently, the coordinates-magnetic field strength characteristics which show the magnetic field distribution 501 are converted into the time-magnetic field strength characteristics such that the distance obtained by the measured interval is divided by the propagation speed (speed of light) of the electromagnetic waves so that dimension is converted into time although it is irrelevant to real time (step 1001). The definition of the above symbols are also used for equations 2 to 5.

$$\begin{cases} t_{mx} = m_x \times \dfrac{dpx}{c} \\ t_{my} = m_y \times \dfrac{dpy}{c} \end{cases} \quad [\text{Equation 2}]$$

This time-magnetic field strength characteristics are subjected to the convolution integration of the delta function, for example, the complex Fourier transform thus calculating the frequency spectrum of the magnetic field strength (step 1002).

$$\begin{cases} \left|A_x\left(\dfrac{M_x}{2}, \dfrac{M_y}{2}\right)\right| e^{j\phi_x\left(\dfrac{M_x}{2}, \dfrac{M_y}{2}\right)} = A_x\left(\dfrac{M_x}{2}, \dfrac{M_y}{2}\right) = FT\{H_x(M_x, M_y), t_{mx}, t_{my}\} \\ \left|A_y\left(\dfrac{M_x}{2}, \dfrac{M_y}{2}\right)\right| e^{j\phi_y\left(\dfrac{M_x}{2}, \dfrac{M_y}{2}\right)} = A_y\left(\dfrac{M_x}{2}, \dfrac{M_y}{2}\right) = FT\{H_y(M_x, M_y), t_{mx}, t_{my}\} \end{cases} \quad [\text{Equation 3}]$$

Then, the frequency of the frequency spectrum of the sampled magnetic field strength is converted into time spectrum, so as to calculate the time waveform of the magnetic field strength for the frequency (step 1003).

$$\begin{cases} H'_x(t_{mx}, t_{my}) = |A_x(m_x, m_y)|e^{j\phi_x(M_x,M_y)} \cdot e^{j\omega_x x} \cdot e^{j\omega_y y} = |A_x(m_x, m_y)|e^{j\{\phi_x(m_x,m_y)+\omega_x x+\omega_y y\}} \\ H'_y(t_{mx}, t_{my}) = |A_y(m_x, m_y)|e^{j\phi_y(M_x,M_y)} \cdot e^{j\omega_x x} \cdot e^{j\omega_y y} = |A_y(m_x, m_y)|e^{j\{\phi_y(m_x,m_y)+\omega_x x+\omega_y y\}} \end{cases}$$ [Equation 4]

The resulting time values of the magnetic field strength is converted into coordinates so as to calculate the coordinates-magnetic field strength distribution for every frequency (step 1004). Then, by performing the detection and the addition with respect to an nπ component at which the coordinates-magnetic field strength distribution for every frequency assumes a peak point or a dip point, the distribution of the electric currents which constitute sources of electromagnetic waves is obtained (step 1005).

$$\begin{cases} I_x = \frac{4\pi \cdot dz^2}{dsx} \sum_{m_x=0}^{\frac{M_x}{2}} \sum_{m_y=0}^{\frac{M_y}{2}} |A_x(m_x, m_y)|e^{j\{\phi_x(m_x,m_y)+\omega_x x+\omega_y y\}} \cdot \delta(\{\phi_x(m_x, m_y) + \omega_x x + \omega_y y\} - n\pi) \\ I_y = \frac{4\pi \cdot dz^2}{dsy} \sum_{m_x=0}^{\frac{M_x}{2}} \sum_{m_y=0}^{\frac{M_y}{2}} |A_y(m_x, m_y)|e^{j\{\phi_y(m_x,m_y)+\omega_x x+\omega_y y\}} \cdot \delta(\{\phi_y(m_x, m_y) + \omega_x x + \omega_y y\} - n\pi) \end{cases}$$ [Equation 5]

where $\delta(\{\phi(mx,my)+\omega x+\omega y\}-n\pi)$ is a function which becomes 1 when $\phi(mx,my)+\omega x+\omega y$ is $n\pi$ and becomes 0 when $\phi(mx,my)+\omega x+\omega y$ takes other value. The inside of a right side Σ corresponds to the magnetic field strength at an observation point when the electric current is present on a position x,y in a single form.

The resolution obtained by such electromagnetic wave source probing method is not influenced by the phase and the frequency of the electromagnetic waves to be measured and is determined based on the measuring distance and the height from the object to be measured. Here, by setting the distance from the object to be measured to a value sufficiently smaller than λ/2, the phase change derived from the propagation can be ignored.

Further, since the measured values do not include phase information, the resolution becomes approximately twice as large as the measuring distance. Assuming that the measuring distance is 10 micrometer, for example, the resolution becomes 20 micrometer. Further, assuming that the measuring distance is 1 micrometer, the resolution becomes 2 micrometer.

Further, in such electromagnetic wave source probing processing, it is possible to obtain the magnitude and the position of the source of the electromagnetic waves without measuring the phase of the near magnetic field distribution. Accordingly, it is unnecessary to perform the measurement in synchronism with the clocks of the object to be measured and hence, the measurement can be performed easily.

Here, by using the algorithm of the secondary Fourier transform or the fast Fourier transform (FFT) in obtaining the magnitude and the phase of the electromagnetic wave source from the measured magnetic field distribution, it is possible to perform the electromagnetic wave source probing rapidly.

Figure 9E:
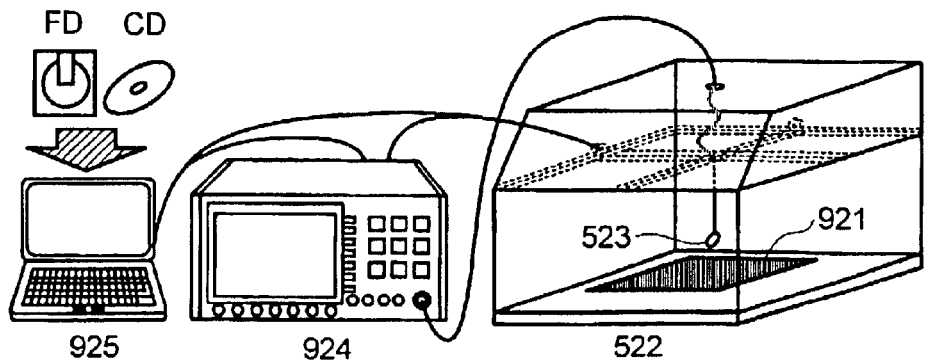

Referring to FIG. 9E, the electromagnetic wave source probing device according to this embodiment includes a magnetic field probe 923 which detects the magnetic field of an object (e.g., a terminal of a semiconductor device) 921 to be measured, a measuring equipment 924 and a computer 925 which is provided with a CPU, a memory, a display screen and the like. The computer includes, for example, a device which reads a storage medium storing information such as a program and data for executing the electromagnetic wave source probing processing or a storage device which stores the read program and the like in the inside of the computer.

First of all, the object 921 to be measured is placed on a stage 922 and the near magnetic field which the device to be measured generates is measured using the probe 103 mounted on the stage. Here, assuming the wavelength of the electromagnetic waves to be measured as λ, the distance which defines the neighborhood in view of the electromagnetic field indicates a numerical value range of a distance r which satisfies $(2\pi r)/\lambda \ll 1$.

In the device of this embodiment, the magnetic field which is generated by the object 921 to be measured at a point electromagnetically near the object 921 to be measured is measured using the three-dimensional magnetic field probe 923 which is formed by combining an x-direction magnetic field probe, a y-direction magnetic field probe and a z-direction field probe, for example. The magnetic field probe 923 (e.g., corresponding to the probe 902) may be constituted of three loop antennas. Here, the probe unit is constituted of 1 to 3 loops, spirals or helical coils each of which extracts only one-directional component of magnetic field. Further, the stage 912 (e.g., corresponding to the stage 903) may be configured to enable the probe movement of first dimension at the minimum and of fifth dimensions (x, y, z, $\phi$, θ) at the maximum.

A magnetic field signals detected by the three-dimensional magnetic field probe are amplified for components of respective directions by a high frequency amplifier (not shown in the drawing) and are transmitted to a measuring equipment 924. As the measuring equipment, any device which can measure a high frequency voltage such as a spectrum analyzer, a vector voltmeter, a network analyzer or the like can be used. The above-mentioned stage 102 and probe 103 are controlled by the computer 925 and the measuring equipment 924 retrieves data.

Figure 9F:
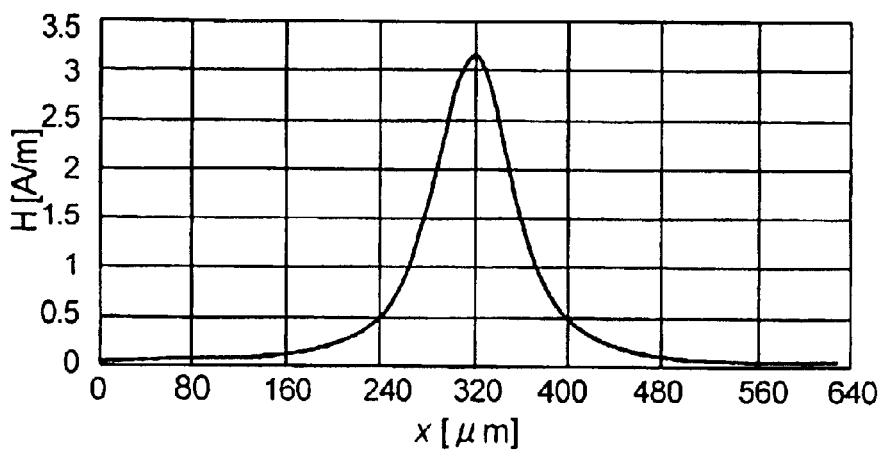
Figure 9G:
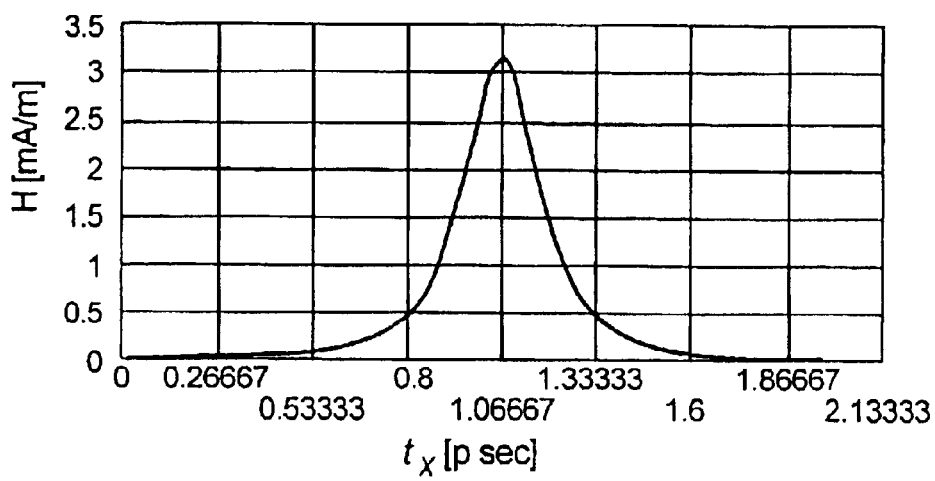
Figure 9H:
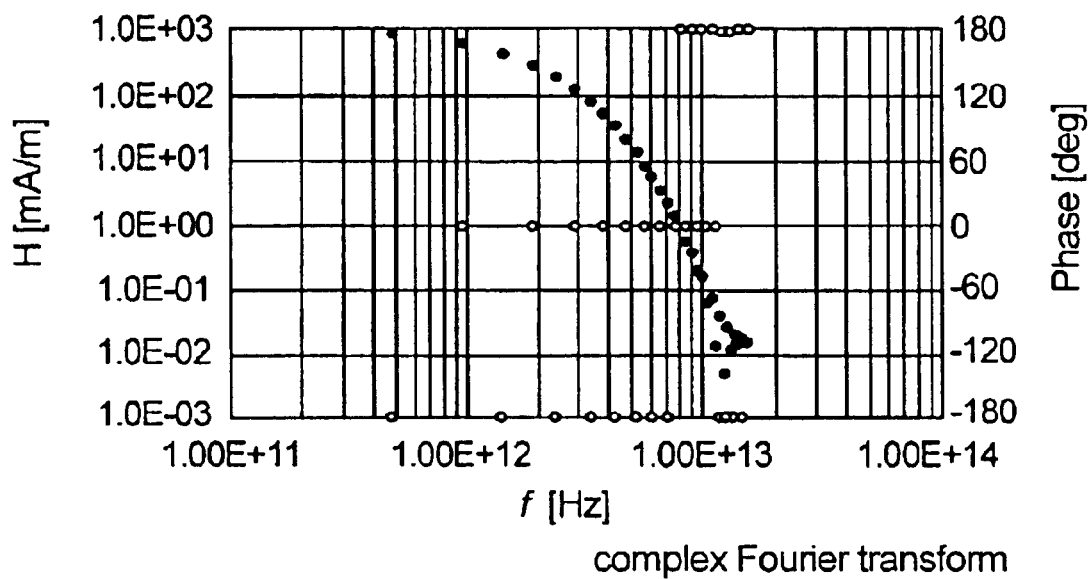
Figure 9I:
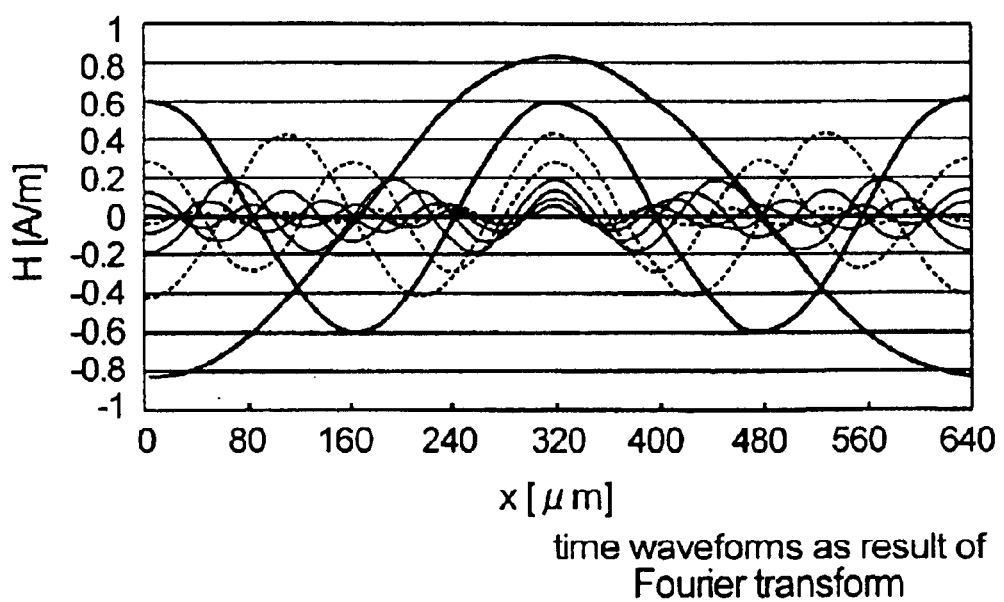

For example, assume that data indicates that the electric current Iy is present at a position x=320 μm is retrieved as shown in FIG. 9F. By dividing the distance of data observation point interval by the speed of electromagnetic waves or the speed of light, the distance-time conversion is performed so as to obtain the time-magnetic field strength distribution. Here, as shown in FIG. 9G, since the measured magnetic field distribution adopts a form of time waveforms, the complex Fourier transform is performed so as to obtain the frequency spectrum of the magnetic field strength as shown in FIG. 9H, that is, the amplitude and the phase for each frequency. Further, as shown in FIG. 9I, the frequency spectrum is subjected to the frequency-time conversion so as to obtain the time waveforms of the magnetic field strength for every frequency. The time waveforms for every frequency component obtained as a result are further subjected to the time-coordinates conversion so as to obtain the coordinates-magnetic field strength distribution for every frequency.

Figure 9J:
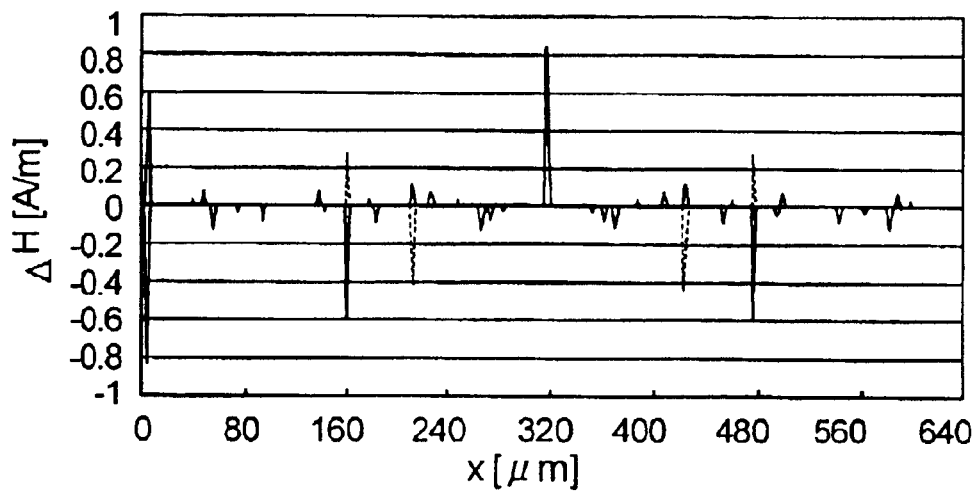

Here, it is understood that when the time waveforms or the coordinates-magnetic field strength distribution for every frequency component is expressed in the same coordinates system as the magnetic field distribution, the time waveforms of all frequency components assume the maximum values at the electric current position (x=320 μm). As shown in FIG. 9J, the values for respective frequency components are obtained as a result of the Fourier transform, that is, the phases of these time waveforms are respectively present at nπ intervals for every frequency.

Figure 9K:
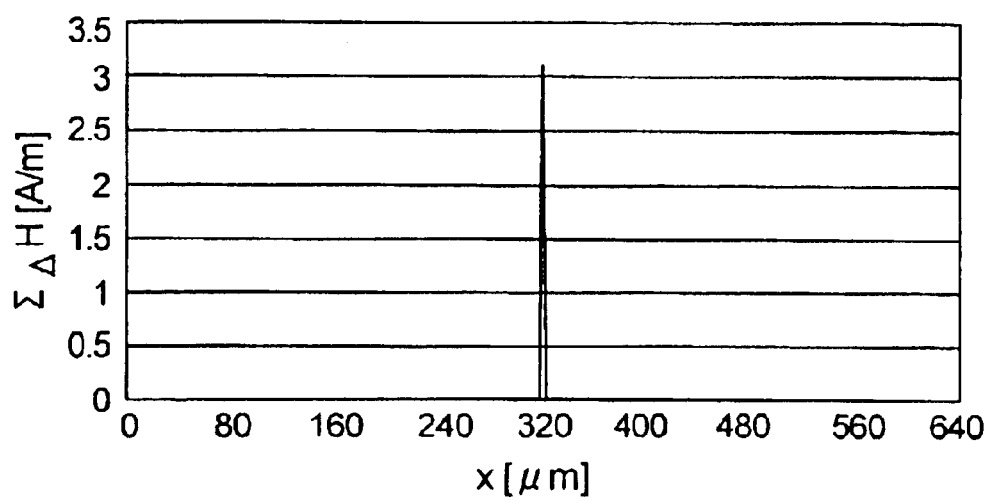

Subsequently, when the values of respective frequency components are added for every peak/dip, that is, for every nπ interval, the sum becomes substantially 0 at positions other than positions where the electric currents are present and hence, the positions of the electric current which is the electromagnetic wave sources is obtained as shown in FIG. 9K. Here, it is possible to obtain all of the position, the magnitude and the phase of the electromagnetic wave source by performing the electromagnetic wave source probing processing based on data fetched by the measuring equipment 924.

On the display screen of the computer 925, a result which shows respective characteristics of arithmetic operation processing may be selectively displayed or only the result of the electric current distribution calculation which is the final result may be displayed as a table.

Here, using the computer, it is possible to obtain the electromagnetic field distribution of the object to be measured at a given position, for example, the distant electromagnetic field distribution based on the result of the electric current distribution.

The techniques above illustrated are utilized to allow the determination of the electromagnetic noise, i.e., the power supply noise intensity and the noise level classification, in the power/GND terminals of the semiconductor device.

The above detailed descriptions are provided to illustrate specific embodiments of the present invention and are not intended to be limiting. Numerous modifications and variations within the scope of the present invention are possible. For example, the testing method and apparatus disclosed in FIGS. 9a–9k may be used to measure electrical field in each terminal to obtain the noise information rather than the magnetic field as described above. Accordingly, the present invention is defined by the appended claims.

What is claimed is:

1. A semiconductor device comprising:
   a semiconductor die having patterned circuitry;
   a plurality of terminals coupled to the die; and
   an indication providing signal noise information of at least one of the terminals,
   wherein the indication is a marking to provide a noise level classification or a value to provide a noise level intensity.

2. The device of claim 1, wherein the plurality of terminals include power supply terminals and ground terminals, where the signal noise information is provided for the power supply terminals and the ground terminals.

3. The device of claim 1, further comprising:
   a package enclosing at least a portion of the die to protect the die, wherein the indication is provided on the package.

4. The device of claim 1, further comprising:
   a package enclosing the die, wherein the indication is provided on the package.

5. A semiconductor device comprising:
   a semiconductor die having patterned circuitry;
   a plurality of terminals coupled to the die; and
   an indication providing signal noise information of at least one of the terminals, wherein the indication is provided on at least one of the terminals.

6. The device of claim 5, wherein the indication is provided by color-coding one or more of the terminals.

7. The device of claim 5, wherein
   the plurality of terminals include power supply terminals and ground terminals,
   where the signal noise information is provided for the power supply terminals and the ground terminals.

8. The device of claim 5, further comprising:
   a package enclosing at least a portion of the die to protect the die, wherein the indication is provided on the package.

9. The device of claim 5, further comprising:
   a package enclosing the die, wherein the indication is provided on the package.

10. A component for manufacturing an electronic device comprising:
    a semiconductor die having patterned circuitry;
    a plurality of terminals coupled to the die; and
    an indication providing signal noise information about at least one of the terminals, wherein the indication is a marking to provide a noise level classification or a value to provide a noise level intensity.

11. The component of claim 10, wherein the plurality of terminals include power supply terminals and ground terminals, where the signal noise information is provided for the power supply terminals and the ground terminals.

12. The component of claim 10, further comprising:
    a package enclosing at least a portion of the die to protect the die, wherein the indication is provided on the package.

13. The component of claim 10, wherein the indication provides information about selected terminals requiring suppression components to reduce electromagnetic interference on the selected terminals.

14. The component of claim 10, wherein the component is a semiconductor device.

15. The component of claim 10, further comprising:
    a semiconductor device including the semiconductor die and the terminals; and
    an information recording medium including the indication.

16. A component for manufacturing an electronic device comprising:
    a semiconductor die having patterned circuitry;
    a plurality of terminals coupled to the die; and
    an indication providing signal noise information about at least one of the terminals, wherein the indication is provided on at least one of the terminals.

17. The component of claim 16, wherein the indication is provided by color-coding one or more of the terminals.

18. The component of claim 16, wherein the plurality of terminals include power supply terminals and ground terminals,
    where the signal noise information is provided for the power supply terminals and the ground terminals.

19. The component of claim 16, further comprising:

a package enclosing at least a portion of the die to protect the die, wherein the indication is provided on the package.

20. The component of claim 16, wherein the indication provides information about selected terminals requiring suppression components to reduce electromagnetic interference on the selected terminals.

21. The component of claim 16, wherein the component is a semiconductor device.

22. The component of claim 16, further comprising:

a semiconductor device including the semiconductor die and the terminals; and an information recording medium including the indication.

23. A component for manufacturing an electronic device comprising:

a semiconductor die having patterned circuitry;

a plurality of terminals coupled to the die;

an indication providing signal noise information about at least one of the terminals, a semiconductor device including the semiconductor die and the terminals; and an information recording medium including the indication, wherein the indication provides the signal noise information in a plurality of frequency bands.

24. The component of claim 23, wherein the information recording medium is a printed document relating to the semiconductor device.

25. The component of claim 23, wherein the information recording medium is a computer readable medium.

26. The component of claim 23, wherein the semiconductor device is configured to be installed onto a printed circuit board and the indication provides information for selectively providing suppression components to one or more of the terminals that are believed to have significant noise levels.

27. The component of claim 23, wherein the semiconductor device is a wafer level chip size package device.

28. A component for manufacturing an electronic device comprising:

a semiconductor die having patterned circuitry;

a plurality of terminals coupled to the die;

an indication providing signal noise information about at least one of the terminals, a semiconductor device including the semiconductor die and the terminals; and an information recording medium including the indication, wherein the semiconductor device is a wafer level chip size package device, the signal noise information relates to a power supply noise intensity, a noise current, noise voltage, or noise electric power value, or a combination thereof.

29. The component of claim 28, wherein the information recording medium is a printed document relating to the semiconductor device.

30. The component of claim 28, wherein the information recording medium is a computer readable medium.

31. The component of claim 28, wherein the semiconductor device is configured to be installed onto a printed circuit board and the indication provides information for selectively providing suppression components to one or more of the terminals that are believed to have significant noise levels.

32. A component for manufacturing an electronic device comprising:

a semiconductor die having patterned circuitry;

a plurality of terminals coupled to the die; and an indication providing signal noise information about at least one of the terminals, wherein the signal noise information provides information using time waveforms or wavelets.

33. The component of claim 32, wherein the plurality of terminals include power supply terminals and ground terminals, where the signal noise information is provided for the power supply terminals and the ground terminals.

34. The component of claim 32, further comprising:

a package enclosing at least a portion of the die to protect the die, wherein the indication is provided on the package.

35. The component of claim 32, wherein the indication provides information about selected terminals requiring suppression components to reduce electromagnetic interference on the selected terminals.

36. The component of claim 32, wherein the component is a semiconductor device.

37. The component of claim 32, further comprising:

a semiconductor device including the semiconductor die and the terminals; and an information recording the medium including the indication.

38. A semiconductor device, comprising:

a semiconductor die having patterned circuitry;

a plurality of power terminals coupled to the die;

a package enclosing the die and portions of the plurality of power terminals; and a marking providing signal noise information of at least one of the power terminals, the marking being provided on the package or the at least one power terminal, the signal noise information being a noise level classification or a noise level intensity, wherein the signal noise information is derived from determining electromagnetic interferences for each of the power terminals.

* * * * *